(12) United States Patent
Limberg

(10) Patent No.: US 7,492,835 B2
(45) Date of Patent: Feb. 17, 2009

(54) SYNCHRODYNING APPARATUS

(76) Inventor: Allen LeRoy Limberg, 1053 Kensington St., Port Charlotte, FL (US) 33952-1523

( * ) Notice: Subject to any disclaimer, the term of this patent is extended or adjusted under 35 U.S.C. 154(b) by 632 days.

(21) Appl. No.: 11/226,592

(22) Filed: Sep. 15, 2005

(65) Prior Publication Data

US 2006/0008032 A1    Jan. 12, 2006

Related U.S. Application Data

(63) Continuation-in-part of application No. 10/271,386, filed on Oct. 15, 2002, now Pat. No. 7,050,491, which is a continuation-in-part of application No. 09/823,500, filed on Mar. 30, 2001, now Pat. No. 6,975,689.

(60) Provisional application No. 60/329,424, filed on Oct. 15, 2001, provisional application No. 60/193,301, filed on Mar. 30, 2000.

(51) Int. Cl.
*H03D 1/24* (2006.01)
*H04L 27/22* (2006.01)

(52) U.S. Cl. .................. 375/320; 375/332; 329/304; 329/347

(58) Field of Classification Search ......... 375/268–270, 375/280, 281, 285, 320, 321, 324, 326, 332, 375/346; 329/304, 347, 349, 353, 356, 357; 348/725, 726; 455/46, 47, 202–204, 208, 455/209

See application file for complete search history.

(56) References Cited

U.S. PATENT DOCUMENTS

| | | | | |
|---|---|---|---|---|
| 6,512,555 | B1 * | 1/2003 | Patel et al. | 348/726 |
| 6,643,334 | B1 * | 11/2003 | Limberg | 375/321 |
| 2003/0072393 | A1 * | 4/2003 | Gu | 375/322 |
| 2004/0121738 | A1 * | 6/2004 | Ide | 455/82 |

* cited by examiner

*Primary Examiner*—Young T. Tse

(57) ABSTRACT

Synchrodyning apparatus in which a PAM IF signal is mixed with unmodulated carriers nominally at the frequency of the carrier, which unmodulated carriers are in quadrature with respect to each other. E.g., the PAM IF signal may be an intermediate-frequency 8VSB digital television signal. The baseband signals resulting from the mixing procedures are additively combined and differentially combined to generate real and imaginary components of a complex baseband signal. The real component of the complex baseband signal is processed for reproducing the digital signal used to modulate the transmitted RF carrier. An automatic frequency and phase control (AFPC) signal for controlling the oscillator circuitry generating the unmodulated carriers is generated by an AFPC detector responding to the imaginary component of the complex baseband signal or to both components of the complex baseband signal. Various combinations of the synchrodyning apparatus with channel-equalization and echo-suppression filtering are described.

22 Claims, 24 Drawing Sheets

Fig. 26
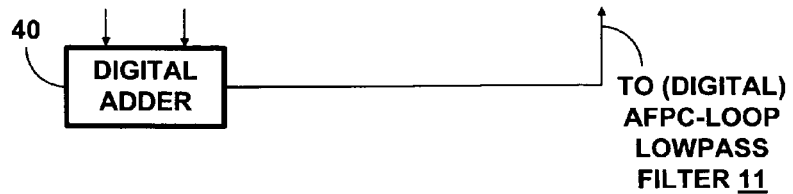
Fig. 27
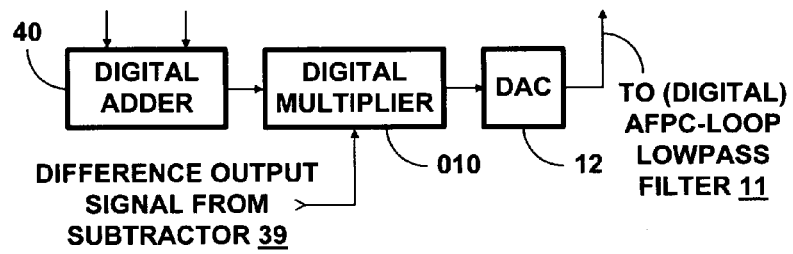
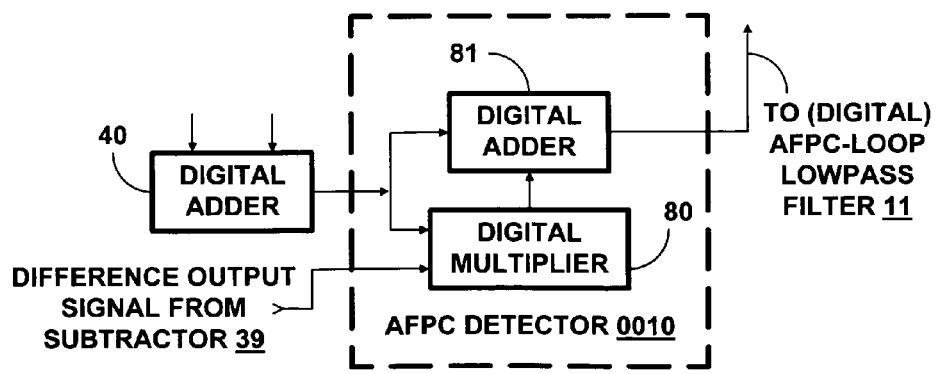
Fig. 28

Fig. 29
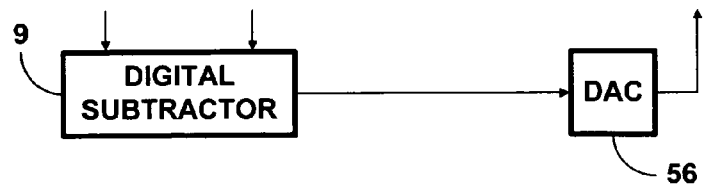
Fig. 30
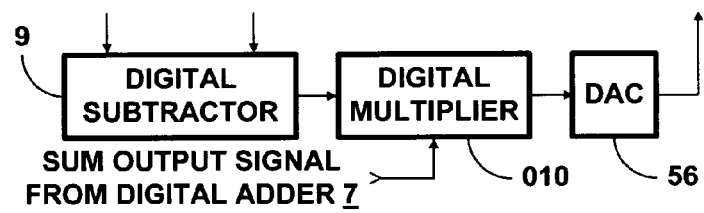
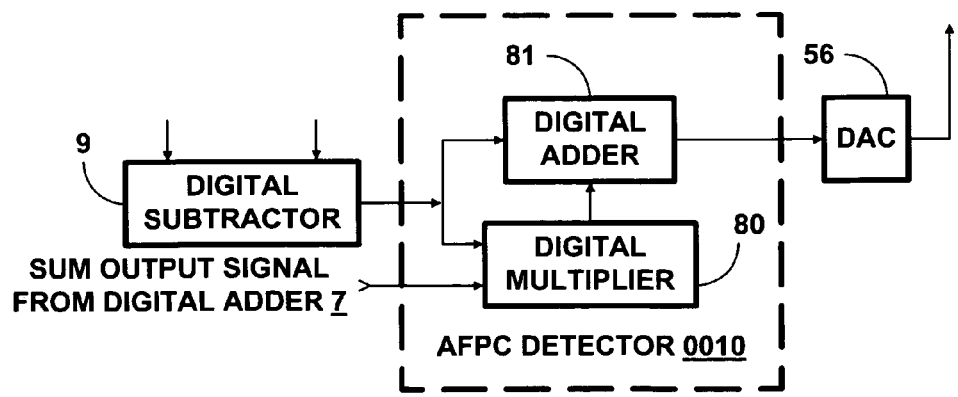
Fig. 31

US 7,492,835 B2

SYNCHRODYNING APPARATUS

This application is a continuation-in-part of U.S. patent application Ser. No. 09/823,500 filed under 35 U.S.C. 111(a) on 30 Mar. 2001, claiming pursuant to 35 U.S.C. 119(e)(1) benefit of the filing date of provisional U.S. patent application Ser. No. 60/193,301 filed under 35 U.S.C. 111(b) on 30 Mar. 2000, and issued as U.S. Pat. No. 6,975,689 on 13 Dec. 2005. This application is also a continuation-in-part of U.S. patent application Ser. No. 10/271,386 filed under 35 U.S.C. 111(a) on 15 Oct. 2002, claiming pursuant to 35 U.S.C. 119(e)(1) benefit of the filing date of provisional U.S. patent application Ser. No. 60/329,424 filed under 35 U.S.C. 111(b) on 15 Oct. 2001, and issued as U.S. Pat. No. 7,050,491 on 23 May 2006.

This application relates to synchrodyne apparatus for receivers of carrier waves the amplitudes of which are modified in accordance with real-only digital signals, as exemplified by a receivers for digital television (DTV) signals as broadcast in the United States of America.

BACKGROUND OF INVENTION

U.S. Pat. No. 6,975,689 issued on 13 Dec. 2005, based on U.S. patent application Ser. No. 9/823,500 filed 30 Mar. 2001, and titled "DIGITAL MODULATION SIGNAL RECEIVER WITH ADAPTIVE CHANNEL EQUALIZATION EMPLOYING DISCRETE FOURIER TRANSFORMS" is incorporated herein by reference. U.S. Pat. No. 7,050,491 issued on 23 May 2006, based on U.S. patent application Ser. No. 10/271,386 filed 15 Oct. 2002, and titled "ADAPTIVE EQUALIZATION OF DIGITAL MODULATING SIGNAL RECOVERED FROM AMPLITUDE-MODULATED SIGNAL SUBJECT TO MULTIPATH" is incorporated herein by reference. These patents describe how discrete Fourier transform methods can be employed for the adaptation of channel-equalization filtering. Other methods have been employed for the adaptation of channel-equalization filtering. The inventions claimed herein concern the configuration of the synchrodyne apparatus and can be used with various ones of these methods for the adaptation of channel-equalization filtering.

U.S. Pat. No. 6,512,555 titled "RADIO RECEIVER FOR VESTIGIAL-SIDEBAND AMPLITUDE-MODULATION DIGITAL TELEVISION SIGNALS" issued 28 Jan. 2003 to C. B. Patel and A. L. R. Limberg. This patent describes digital synchrodyning procedures in which an intermediate-frequency 8VSB DTV signal is mixed with unmodulated carriers nominally at 0° and 90° phasings respective to pilot carrier to recover real and imaginary components of a complex baseband DTV signal. The imaginary component of the complex baseband DTV signal is lowpass filtered to develop an automatic frequency and phase control (AFPC) signal for controlling the oscillator circuitry generating the unmodulated carriers at 0° and 90° phasings respective to pilot carrier. The real component of the complex baseband DTV signal is processed for reproducing the baseband DTV signal used to modulate the radio-frequency carrier transmitted from a broadcasting station selected for reception. This bandpass tracker tracks the phase of the pilot carrier that the selected broadcasting station transmits, and tracking falters if the pilot carrier is suppressed. The pilot carrier is suppressed during certain sorts of multipath reception conditions, for example.

U.S. Pat. No. 5,479,449 titled "DIGITAL VSB DETECTOR WITH BANDPASS PHASE TRACKER, AS FOR INCLUSION IN AN HDTV RECEIVER" issued 26 Dec. 1995 to C. B. Patel and A. L. R. Limberg. This patent describes digital synchrodyning procedures in which an intermediate-frequency 8VSB DTV signal is mixed with unmodulated carrier nominally at 0° phasing respective to pilot carrier to recover a real baseband DTV signal. The IF 8VSB DTV signal is filtered with a narrow bandpass filter to extract pilot carrier which is mixed with unmodulated carrier nominally at 90° phasing respective to pilot carrier. This is done to develop an automatic frequency and phase control (AFPC) signal for controlling the oscillator circuitry generating the unmodulated carriers at 0° and 90° phasings respective to pilot carrier.

U.S. Pat. No. 5,715,012 titled "RADIO RECEIVERS FOR RECEIVING BOTH VSB AND QAM DIGITAL HDTV SIGNALS" issued 3 Feb. 1998 to C. B. Patel and A. L. R. Limberg. This patent describes digital synchrodyning procedures in which an intermediate-frequency QAM DTV signal is mixed with unmodulated carriers at 0° and 90° phasings to recover real and imaginary components of a complex baseband DTV signal. The QAM DTV signal has no pilot carrier. The AFPC signal for controlling the oscillator circuitry generating the unmodulated carriers at 0° and 90° phasings respective to pilot carrier is developed by lowpass filtering the product of the real and the imaginary components of the complex baseband DTV signal, in accordance with the Costas principle.

U.S. Pat. No. 5,809,088 titled "DIGITAL CARRIER WAVE RESTORING DEVICE AND METHOD FOR USE IN A TELEVISION SIGNAL RECEIVER" issued 26 Sep. 1998 to D. S. Han. This patent describes digital synchrodyning procedures in which an intermediate-frequency DTV signal is mixed with unmodulated carriers at 0° and 90° phasings respective to pilot carrier to recover real and imaginary components of a complex baseband DTV signal. The AFPC signal for controlling the oscillator circuitry generating the unmodulated carriers at 0° and 90° phasings respective to pilot carrier is developed by lowpass filtering the product of the real and the imaginary components of the complex baseband DTV signal, in accordance with the Costas principle. This bandpass tracker continues tracking even if the pilot carrier is suppressed, which can occur during certain sorts of multipath reception conditions. In DTV receivers in which the passband rolls off in the carrier region of the frequency spectrum, the pilot carrier may be undesirably suppressed owing to mistuning of the selective front-end circuitry of the DTV receiver.

In the ensuing mathematical descriptions of the operation of synchrodyning apparatuses in DTV receivers, $\omega_C$ is the carrier frequency of the intermediate-frequency input signal that is to be synchrodyned to baseband, and $\omega_S$ is the frequency of a particular component of the signal modulating the amplitude of that carrier frequency. $A_S$ is the respective amplitude of that component, and $\phi_S$ is the respective phase of that component respective to an arbitrary reference. Time is the variable t.

The operation of the synchrodyning apparatus in a prior-art DTV receiver can be one in which an intermediate-frequency input signal that is essentially a summation of $A_S \cos[(\omega_C - \omega_S)t - \phi_S]$ terms for various $\omega_S$ recovered by an odd number of frequency conversions is multiplicatively mixed with a $\cos \omega_C t$ carrier to recover a real baseband signal and with a $\sin \omega_C t$ carrier to recover an imaginary baseband signal. The real baseband signal recovered by the synchrodyning apparatus in such a receiver is a summation of $\cos(\omega_S t + \phi_S)$ terms, in accordance with distributed application of the $\cos A \cos B = 0.5 \cos(A+B) + 0.5 \cos(A-B)$ trigonometric identity, followed by lowpass filtering to suppress the $\cos(A+B)$ terms. The imaginary signal recovered by the synchrodyning apparatus in such a receiver is a summation of $\sin(\omega_S t + \phi_S)$ terms, in accordance with distributed application of the $\sin A \cos B = 0.5 \sin(A+B) +$ 0.5 sin(A−B) trigonometric identity, followed by lowpass filtering to suppress the sin(A+B) terms.

Alternatively, the operation of the synchrodyning apparatus in a prior-art DTV receiver can be one in which an intermediate-frequency input signal that is essentially a summation of cos $[(\omega_C+\omega_S)t+\phi_S]$ terms recovered by an even number of frequency conversions is multiplicatively mixed with a cos $\omega_C t$ carrier to recover a real baseband signal and with a sin $\omega_C t$ carrier to recover an imaginary baseband signal. The real baseband signal recovered by the synchrodyning apparatus in such a receiver is a summation of cos$(-\omega_S t-\phi_S)$ terms, in accordance with distributed application of the cos A cos B=0.5 cos(A+B)+0.5 cos(A−B) trigonometric identity, followed by lowpass filtering to suppress the cos(A+B) terms. The summation of cos$(-\omega_S t-\phi_S)$ terms is the same as a summation of cos$(\omega_S t+\phi_S)$ terms. The imaginary signal recovered by the synchrodyning apparatus in such a receiver is a summation of sin$(-\omega_S t-\phi_S)$ terms, in accordance with distributed application of the sin A cos B=0.5 sin(A+B)+0.5 sin(A−B) trigonometric identity, followed by lowpass filtering to suppress the sin(A+B) terms. The summation of sin$(-\omega_S t-\phi_S)$ terms is the negative of a summation of sin$(\omega_S t+\phi_S)$ terms.

In accordance with an aspect of the invention the synchrodyning apparatus in a DTV receiver is operated so that an intermediate-frequency input signal that is essentially a summation of cos $[(\omega_C-\omega_S)t-\phi_S]$ terms recovered by an odd number of frequency conversions is multiplicatively mixed with a cos $[\omega_C t+(\pi/4)]$ carrier and with a cos $[\omega_C t-(\pi/4)]$ carrier. Multiplication by the cos $[\omega_C t+(\pi/4)]$ carrier generates a summation of 0.5 cos $[\omega_S t+\phi_S+(\pi/4)]$ baseband terms plus a summation of 0.5 cos $[(2\omega_C-\omega_S)t-\phi_S-(\pi/4)]$ image terms, in accordance with distributed application of the cos A cos B=0.5 cos(A+B)+0.5 cos(A−B) trigonometric identity. Lowpass filtering separates the 0.5 cos $[\omega_S t+\phi_S+(\pi/4)]$ baseband terms from the image terms to supply a first mixer output signal. Multiplication of the summation of cos $[(\omega_C-\omega_S)t-\phi_S]$ terms by the cos $[(\omega_C t-(\pi/4)]$ carrier generates a summation of 0.5 cos $[\omega_S t+\phi_S-(\pi/4)]$ baseband terms plus a summation of 0.5 cos $[(2\omega_C-\omega_D)t-\phi_S-(\pi/4)]$ image terms, in accordance with distributed application of the cos A cos B=0.5 cos(A+B)+0.5 cos(A−B) trigonometric identity. Lowpass filtering separates the 0.5 cos $[\omega_S t+\phi_S+(\pi/4)]$ baseband terms from the image terms to supply a second mixer output signal. Summing the first and second mixer output signals generates, in accordance with the cos A+cos B=2 cos 0.5 (A+B) cos 0.5 (A−B) trigonometric identity, a summation of cos$(\pi/4)$ cos $(\omega_S t+\phi_S)$ terms, reproducing the baseband modulating signal scaled by the factor 0.707. Differentially combining the first and second mixer output signals generates, in accordance with the cos B−cos A=2 sin 0.5 (A+B) sin 0.5 (A−B) trigonometric identity, a summation of sin$(\pi/4)$ sin$(\omega_S t+\phi_S)$ terms that is the Hilbert transform of the baseband modulating signal scaled by the factor 0.707.

In accordance with another aspect of the invention, the synchrodyning apparatus in a DTV receiver is operated so that an intermediate-frequency input signal that is essentially a summation of cos $[(\omega_C+\omega_S)t+\phi_S]$ terms recovered by an even number of frequency conversions is multiplicatively mixed with a cos $[\omega_C t+(\pi/4)]$ carrier and with a cos $[\omega_C t-(\pi/4)]$ carrier. Multiplication by the cos $[\omega_C t+(\pi/4)]$ carrier generates a summation of 0.5 cos $[\omega_S t+\phi_S-(\pi/4)]$ baseband terms plus a summation of 0.5 cos $[(2\omega_C+\omega_S)t+\phi_S+(\pi/4)]$ image terms, in accordance with distributed application of the cos A cos B=0.5 cos(A+B)+0.5 cos(A−B) trigonometric identity. Lowpass filtering separates the 0.5 cos $[\omega_S t+\phi_S-(\pi/4)]$ baseband terms from the image terms to supply a first mixer output signal. Multiplication of the summation of cos $[(\omega_C+\omega_S)t+\phi_S]$ terms by the cos $[\omega_C t-(\pi/4)]$ carrier generates a summation of 0.5 cos $[\omega_S t+\phi_S+(\pi/4)]$ baseband terms plus a summation of 0.5 cos $[(2\omega_C+\omega_S)t-\phi_S-(\pi/4)]$ image terms, in accordance with distributed application of the cos A cos B=0.5 cos(A+B)+0.5 cos(A−B) trigonometric identity. Lowpass filtering separates the 0.5 cos $[\omega_S t+\phi_S+(\pi/4)]$ baseband terms from the image terms to supply a second mixer output signal. Summing the first and second mixer output signals generates, in accordance with the cos A+cos B=2 cos 0.5 (A+B) cos 0.5 (A−B) trigonometric identity, a summation of cos$(\pi/4)$cos $\omega_S t+\phi_S)$ terms, reproducing the baseband modulating signal scaled by the factor 0.707. Differentially combining the first and second mixer output signals generates, in accordance with the cos B−cos A=2 sin 0.5 (A+B) sin 0.5 (A−B) trigonometric identity, a summation of sin$(\pi/4)$sin$(\omega_S t+\phi_S)$ terms that is the Hilbert transform of the baseband modulating signal scaled by the factor 0.707.

Note that the 0.5 cos $[(2\omega_C+\omega_S)t-\phi_S-(\pi/4)]$ and 0.5 cos $[(2\omega_C-\omega_S)t-\phi_S-(\pi/4)]$ image terms are easier to suppress by lowpass filtering than 0.5 cos $[(2\omega_C-\omega_S)t-\phi_S-(\pi/4)]$ and 0.5 cos $[(2\omega_C-\omega_S)t-\phi_S+(\pi/4)]$ image terms are. Accordingly, there is reason for preferring an even number of frequency conversions of the received RF signal to develop the IF signal used for synchrodyning.

SUMMARY OF THE INVENTION

The invention concerns synchrodyning apparatus in which an intermediate-frequency 8VSB DTV signal is mixed with unmodulated carriers nominally at the frequency of the carrier, which unmodulated carriers are in quadrature with respect to each other. The baseband signals resulting from these mixing procedures are additively combined and differentially combined to generate real and imaginary components of a complex baseband DTV signal. The real component of the complex baseband DTV signal is processed for reproducing the baseband DTV signal used to modulate the radio-frequency carrier transmitted from a broadcasting station selected for reception. An automatic frequency and phase control (AFPC) signal for controlling the oscillator circuitry generating the unmodulated carriers is generated by an AFPC detector responding to the imaginary component of the complex baseband DTV signal or to both components of the complex baseband DTV signal.

In certain embodiments of the invention the real component of the complex baseband DTV signal is generated by additively combining baseband signals resulting from mixing the intermediate-frequency 8VSB DTV signal with unmodulated carriers nominally at −45° and +45° phasings respective to the pilot carrier. In other embodiments of the invention the real component of the complex baseband DTV signal is generated by differentially combining baseband signals resulting from mixing the intermediate-frequency 8VSB DTV signal with unmodulated carriers nominally at +45° and +135° phasings respective to the pilot carrier.

Further aspects of the invention concern how the novel synchrodyning apparatus is combined in various ways with channel-equalization filtering. The precepts of the invention are applicable generally to pulse-amplitude-modulation (PAM) signals, no matter whether they use single-sideband (SSB), vestigial-sideband (VSB) or double sideband (DSB) amplitude modulation.

BRIEF DESCRIPTIONS OF THE DRAWING FIGURES

FIG. 26 is a schematic diagram showing in detail one way AFPC detection is implemented in the DTV signal receivers of FIGS. 3 and 12.

FIG. 27 is a schematic diagram showing in detail another way AFPC detection is implemented in the DTV signal receivers of FIGS. 3 and 12.

FIG. 28 is a schematic diagram showing in detail yet another way AFPC detection is implemented in the DTV signal receivers of FIGS. 3 and 12.

FIG. 29 is a schematic diagram showing in detail one way AFPC detection is implemented in the DTV signal receivers of FIGS. 5 and 15.

FIG. 30 is a schematic diagram showing in detail another way AFPC detection is implemented in the DTV signal receivers of FIGS. 5 and 15.

FIG. 31 is a schematic diagram showing in detail yet another way AFPC detection is implemented in the DTV signal receivers of FIGS. 5 and 15.

DETAILED DESCRIPTION

Figure 1:
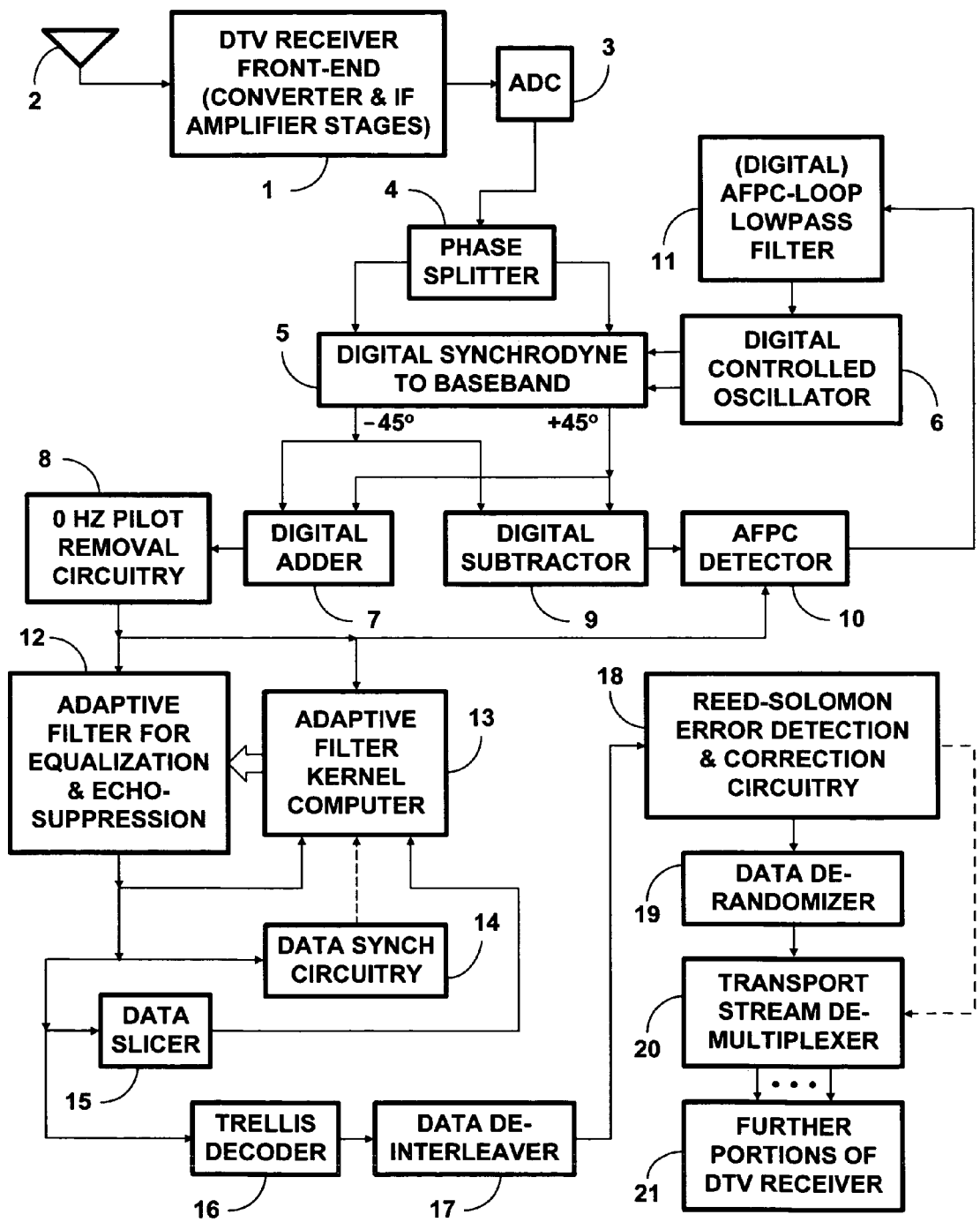
FIG. 1 is a schematic diagram of a DTV signal receiver that uses baseband channel-equalization and echo-suppression filtering, and that includes synchrodyning apparatus embodying an aspect of the invention.

FIG. 1 shows a DTV signal receiver that includes synchrodyning apparatus embodying the invention. A DTV signal receiver front-end 1 is connected for responding to radio-frequency DTV signal supplied thereto from an antenna 2, thereby to supply amplified intermediate-frequency DTV signal to an analog-to-digital converter 3 for digitization. The ADC 3 is connected for supplying the resulting digitized IF DTV signal to a phase-splitter 4, which converts the digitized IF DTV signal to complex analytic form.

The phase-splitter 4 can take any one of a variety of forms in the FIG. 1 DTV signal receiver. E.g., the phase splitter 4 comprises a Hilbert transform filter connected for responding to the digitized IF DTV signal from the ADC 3 to develop the imaginary component of the complex digitized IF DTV signal. The real component of the complex digitized IF DTV signal is then the digitized IF DTV signal from the ADC 3 as delayed within the phase splitter 4 to compensate for the latent delay in the Hilbert transform filter. Another form of phase splitter employs Rader filters as described by C. B. Patel and A. L. R. Limberg in their U.S. Pat. No. 5,548,617 issued 20 Aug. 1996 and titled "DIGITAL VSB DETECTOR WITH BANDPASS PHASE TRACKER USING RADER FILTERS, AS FOR USE IN AN HDTV RECEIVER". Yet another form of phase splitter employs Ng filters as described by C. B. Patel and A. L. R. Limberg in their U.S. Pat. No. 5,731,848 issued 24 Mar. 1998 and titled "DIGITAL VSB DETECTOR WITH BANDPASS PHASE TRACKER USING NG FILTERS, AS FOR USE IN AN HDTV RECEIVER".

The phase splitter 4 is connected for supplying the complex digitized IF DTV signal to synchrodyning apparatus 5 for performing a digital synchrodyne to baseband. The synchrodyning apparatus 5 differs from prior-art synchrodyning apparatus in that synchronous detection is performed at −45° and +45° phasings respective to the pilot carrier, rather than at 0° and +90° phasings. Accordingly, the baseband signals resulting from synchronous detection have similar real components and have anti-phase imaginary components. A digital controlled oscillator (DCO) 6 is connected for supplying the synchrodyning apparatus 5 with digital descriptions of carrier waves at −45° and +45° phasings respective to the pilot carrier. The frequency and phasings of the DCO 6 are controlled responsive to an automatic frequency and phase control (AFPC) signal. A digital adder 7 is connected for additively combining the baseband signals resulting from synchrodyning at −45° and +45° phasings respective to the pilot carrier. The sum output signal from the adder 7 corresponds to the essentially real baseband DTV signal that would result from synchrodyning at 0° phasing respective to the pilot carrier. During favorable reception conditions this essentially real baseband signal reproduces the succession of digital symbols used to modulate the 8VSB DTV RF signal. Pilot removal circuitry 8 is connected for responding to the baseband DTV signal supplied as sum output signal from the adder 7. The pilot removal circuitry 8 supplies a baseband DTV signal response from which the 0 Hz pilot has been removed. The pilot removal circuitry 8 can take any one of a variety of forms known to those skilled in the art. E.g., the direct component of the data field synchronizing signal in the baseband DTV signal supplied as sum output signal from the adder 7 can be determined and subtracted from that baseband DTV signal to generate the response from the pilot removal circuitry 8.

A digital subtractor 9 is connected for differentially combining the baseband signals resulting from synchrodyning at −45° and +45° phasings respective to the pilot carrier. The difference output signal from the subtractor 9 corresponds to the essentially imaginary baseband DTV signal that would result from synchrodyning at 90° phasing respective to the pilot carrier. An AFPC detector 10 is connected for responding to the difference output signal from the subtractor 9. FIG. 1 shows the AFPC detector 10 connected for also responding to the baseband DTV signal from the pilot removal circuitry 8. Presuming the AFPC detector 10 to comprise a digital multiplier for multiplying the difference output signal from the subtractor 9 by this baseband DTV signal, the difference output signal from the subtractor 9 should be delayed by shim delay to compensate for latent delay in the pilot removal circuitry 8. This shim delay is not explicitly shown in FIG. 1. A (digital) AFPC-loop lowpass filter 11 is connected for responding to the AFPC detector 10 output signal to generate a response thereto, which is applied to the DCO 6 as AFPC signal. Alternatively, the AFPC detector 10 is simply a direct coupling of the output port of the subtractor 9 to the input port of the AFPC-loop lowpass filter 11, with the baseband DTV signal from the pilot removal circuitry 8 not being used by the AFPC detector 10.

An adaptive filter 12 used for channel-equalization and echo suppression is connected to receive as input signal thereto the baseband DTV signal response from the pilot removal circuitry 8. A computer 13 computes the weighting coefficients in the kernel of the adaptive filter 12 in accordance with prior art, the adaptive filter 12 preferably being a fractional equalizer clocked at a multiple of the baud rate of the DTV signal. E.g., a fractional equalizer can be constructed as described in U.S. Pat. No. 6,377,312 titled "ADAPTIVE FRACTIONALLY SPACED EQUALIZER FOR RECEIVED RADIO TRANSMISSIONS WITH DIGITAL CONTENT, SUCH AS DTV SIGNALS" and issued 23 Apr. 2002 to A. L. R. Limberg and C. B. Patel. FIG. 1 shows the computer 13 also connected for receiving the baseband DTV signal response from the pilot removal circuitry 8. This facilitates the computer 13 being arranged to calculate initial weighting coefficients for the adaptive filter 12 from the training signals contained in the initial data segments of data fields. The baseband DTV signal response from the pilot removal circuitry 8 is also supplied to data synchronizing circuitry 14, to a data slicer 15 and to a trellis decoder 16 of the twelve-phase type conventionally employed in an ATSC VSB DTV receiver.

Timing recovery circuitry within the data synchronizing circuitry 14 adjusts the frequency and phase of the sampling clock so that the timing of samples during analog-to-digital conversion by the ADC 3 is in temporal alignment with the transmission of symbols on the VSB carrier. The timing recovery circuitry is of the same general type as S. U. H. Qureshi described for use with pulse amplitude modulation (PAM) signals in his paper "Timing Recovery for Equalized Partial-Response Systems, IEEE Transactions on Communications, December 1976, pp. 1326-1333.

The data slicer 15 supplies the computer 13 with estimates of the symbols actually transmitted. Typically, there is decimation filtering to reduce sampling rate to baud rate before a bin comparison is performed by the data slicer 15. In various designs the response of this decimation filtering is utilized by the data synchronizing circuitry 14, or by the trellis decoder 16, or by both. In preferred designs the data slicer 15 re-samples the data slicing results to the original sampling rate of its input signal and supplies the re-sampled data slicing results to the computer 13. The computer 13 develops an error signal by differentially combining the adaptive filter 12 response with the re-sampled estimates of the symbols actually transmitted. The computer 13 computes the adjustments to be made to the weighting coefficients of the adaptive filter 12 kernel based on this error signal, using any of a number of techniques known in the prior art. The data slicer 15 may comprise a "smart" data-slicer described in U.S. Pat. No. 6,178,209 issued 19 Jun. 1998 to S. N. Hulyalkar et alii and titled "METHOD OF ESTIMATING TRELLIS ENCODED SYMBOLS UTILIZING SIMPLIFIED TRELLIS DECODING".

The trellis decoder 16 supplies data resulting from symbol decoding to a data de-interleaver 17, which undoes the convolutional interleaving done at the ATSC VSB DTV over-the-air (OTA) broadcast transmitter, so as to disperse extended-duration noise bursts that result from excitation of the IF amplifiers by impulse noise. The data de-interleaver 17 is connected to supply de-interleaved data in bytes to circuitry 18 for detecting and correcting errors in response to Reed-Solomon forward error correction coding contained in the de-interleaved data. The circuitry 18 is connected to supply error-corrected data to a data de-randomizer 19, which regenerates the stream of data packets supplied to the ATSC VSB DTV broadcast transmitter for over-the-air broadcasting. This stream of data packets is supplied to a transport stream de-multiplexer 20. The circuitry 18 is connected to supply the transport stream de-multiplexer 20 indications of which data packets contain uncorrected byte errors, and the de-multiplexer 20 does not forward these data packets to further portions 21 of the DTV receiver. The transport stream de-multiplexer 20 sorts to the further portions 21 of the DTV receiver those data packets that the circuitry 18 indicates are free from uncorrected byte errors. This sorting is performed responsive to the PIDs (packet identification bytes) in those data packets. Data packets descriptive of compressed video are selected to an MPEG-2 decoder, data packets descriptive of audio are selected to an AC-3 decoder, and so forth. In sum, elements 12-21 function similarly to the way such elements function in other ATSC VSB DTV receivers previously known.

Figure 2:
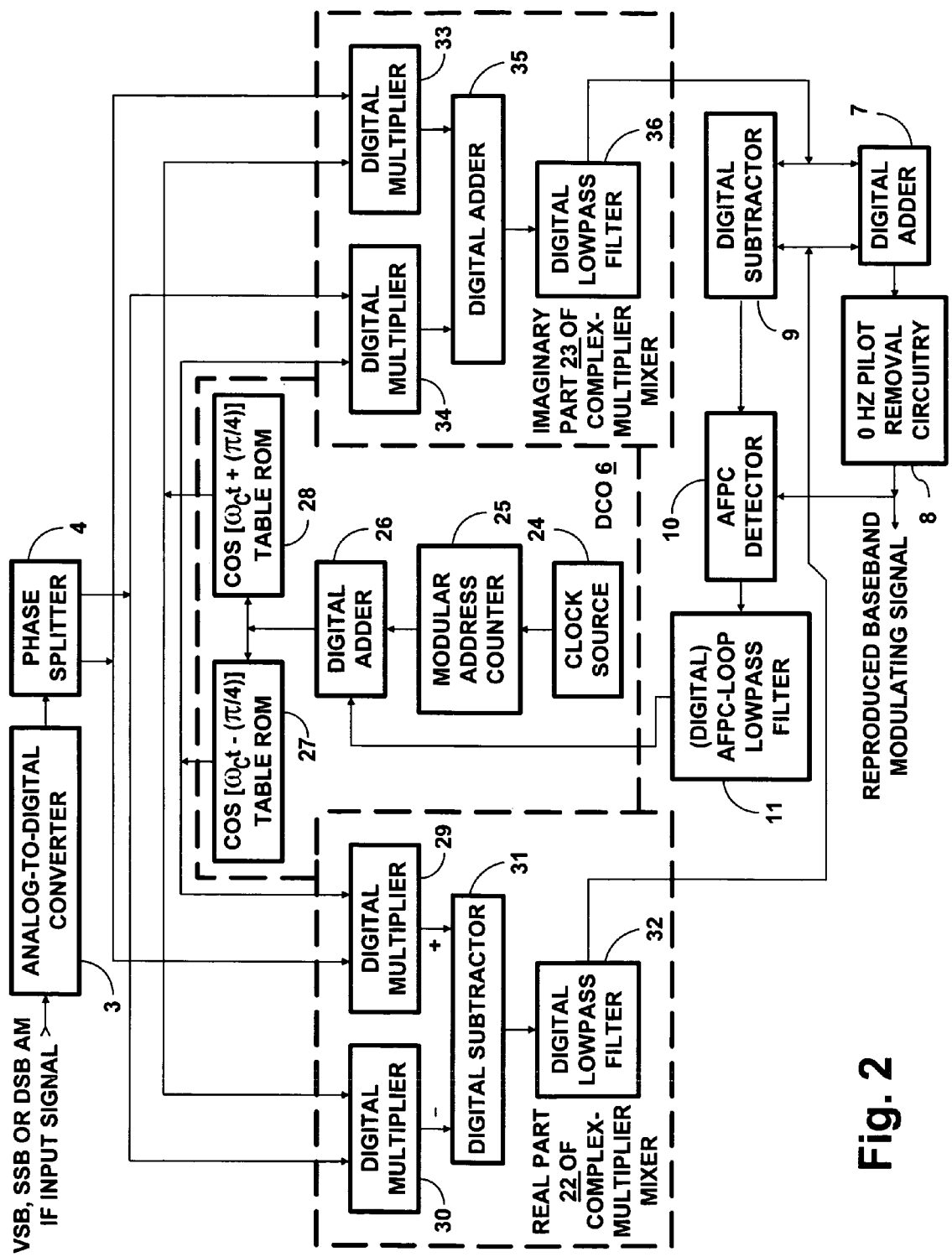
FIG. 2 is a detailed schematic diagram of the synchrodyning apparatus used in the FIG. 1 DTV signal receiver.

FIG. 2 shows in more detail the synchrodyning apparatus 5 used in the FIG. 1 DTV signal receiver for performing a digital synchrodyne to baseband. The FIG. 2 synchrodyning apparatus is of a sort that can be used with a vestigial-sideband (VSB), single-sideband (SSB) or double-sideband (DSB) amplitude-modulation (AM) intermediate-frequency (IF) input signal. The FIG. 2 synchrodyning apparatus comprises a real part 22 and an imaginary part 23 of a complex-multiplier mixer connected for multiplying the complex IF input signal by complex carrier signals supplied from the DCO 6. (Note that the terms "real" and "imaginary" are referenced to axes shifted $-45°$ respective to $0°$ carrier when applied to parts 22 and 23 of the complex-multiplier mixer or to its operations.) The digital adder 7 additively combines the mixer 22 output signal and the mixer 23 output signal to generate its sum output signal, which is supplied to the pilot removal circuitry 8. The pilot removal circuitry 8 reproduces the baseband modulating signal of the VSB, SSB or DSB AM received signal supplied at IF to the ADC 3. The digital subtractor 9 differentially combines the mixer 22 output signal and the mixer 23 output signal to generate its difference output signal, which is used in the generation of AFPC signal for the DCO 6.

The digital controlled oscillator 6 supplies respective cos $[(\omega_C t-(\pi/4)]$ and cos $[\omega_C t+(\pi/4)]$ components of a complex carrier wave to be used for synchrodyning the complex digitized IF signal from the phase splitter 4. A clock source 24 for the DCO 6 supplies clock pulses to the count input connection of a modular address counter 25 in the DCO 6. The counting of the clock pulses by the counter 25 generates a succession of addresses that define a triangular system function. Counting employs modular arithmetic. That is, counting begins with zero and progresses with consecutive positive integers until a prescribed final count is reached, at which time the count rolls over to begin again at zero. The count output connection of the counter 25 is connected for supplying count to a digital adder 26 as one of two addendum inputs, the other addendum input being the AFPC signal supplied as AFPC-loop lowpass filter 11 response. The digital adder 26 is constructed to conform to the same modular arithmetic as the counter 25 and is connected for supplying its sum output signal to read-only memories 27 and 28 as input addressing. The ROM 27 stores a cos $[\omega_C t-(\pi/4)]$ look-up table, where $\omega_C$ is the nominal angular frequency of the IF input signal carrier wave; and the ROM 28 stores a cos $[\omega_C t+(\pi/4)]$ look-up table. Responsive to the sum output signal that the adder 26 supplies as input addressing, the ROMs 27 and 28 generate respective waves of angular frequency $\omega_C$ with respective controlled phases that are in quadrature with each other. The complex-multiplier mixer multiplies the complex IF input signal of form A+jB supplied by the phase splitter 4 by a complex carrier wave of form C+jD to generate a complex product of the form (AC−BD)+j(AD+BC). The C and D terms of the complex carrier wave are supplied by the ROM 27 and by the ROM 28, respectively.

The real part 22 of the complex-multiplier mixer comprises digital multipliers 29 and 30, a digital subtractor 31 and a digital lowpass filter 32. The AC partial product is generated by the digital multiplier 29 multiplying the real component of the complex IF input signal by the carrier wave nominally of value cos $[\omega_C t-(\pi/4)]$. The BD partial product is generated by the digital multiplier 30 multiplying the imaginary component of the complex IF input signal by the carrier wave nominally of value cos $[\omega_C t+(\pi/4)]$. The digital subtractor 31 is connected for differentially combining the AC and BD partial products generated by the digital multipliers 29 and 30. The digital lowpass filter 32 is connected for responding to the baseband portion of the AC−BD difference output signal from the digital subtractor 31, but not the image portion of that signal. The filter 32 response provides the output signal of the real part 22 of the complex-multiplier mixer.

The imaginary part 23 of the complex-multiplier mixer comprises digital multipliers 33 and 34, a digital adder 35 and a digital lowpass filter 36. The AD partial product is generated by the digital multiplier 33 multiplying the real component of the complex IF input signal by the carrier wave nominally of value cos $[\omega_C t+(\pi/4)]$. The BC partial product is generated by the digital multiplier 34 multiplying the imaginary component of the complex IF input signal by the carrier wave nominally of value cos $[\omega_C t-(\pi/4)]$. The digital adder 35 is connected for additively combining the AD and BC partial products generated by the digital multipliers 33 and 34. The digital lowpass filter 36 is connected for responding to the baseband portion of the AD+BC sum output signal from the digital adder 35, but not the image portion of that signal. The filter 36 response provides the output signal of the imaginary part 23 of the complex-multiplier mixer.

Figure 3:
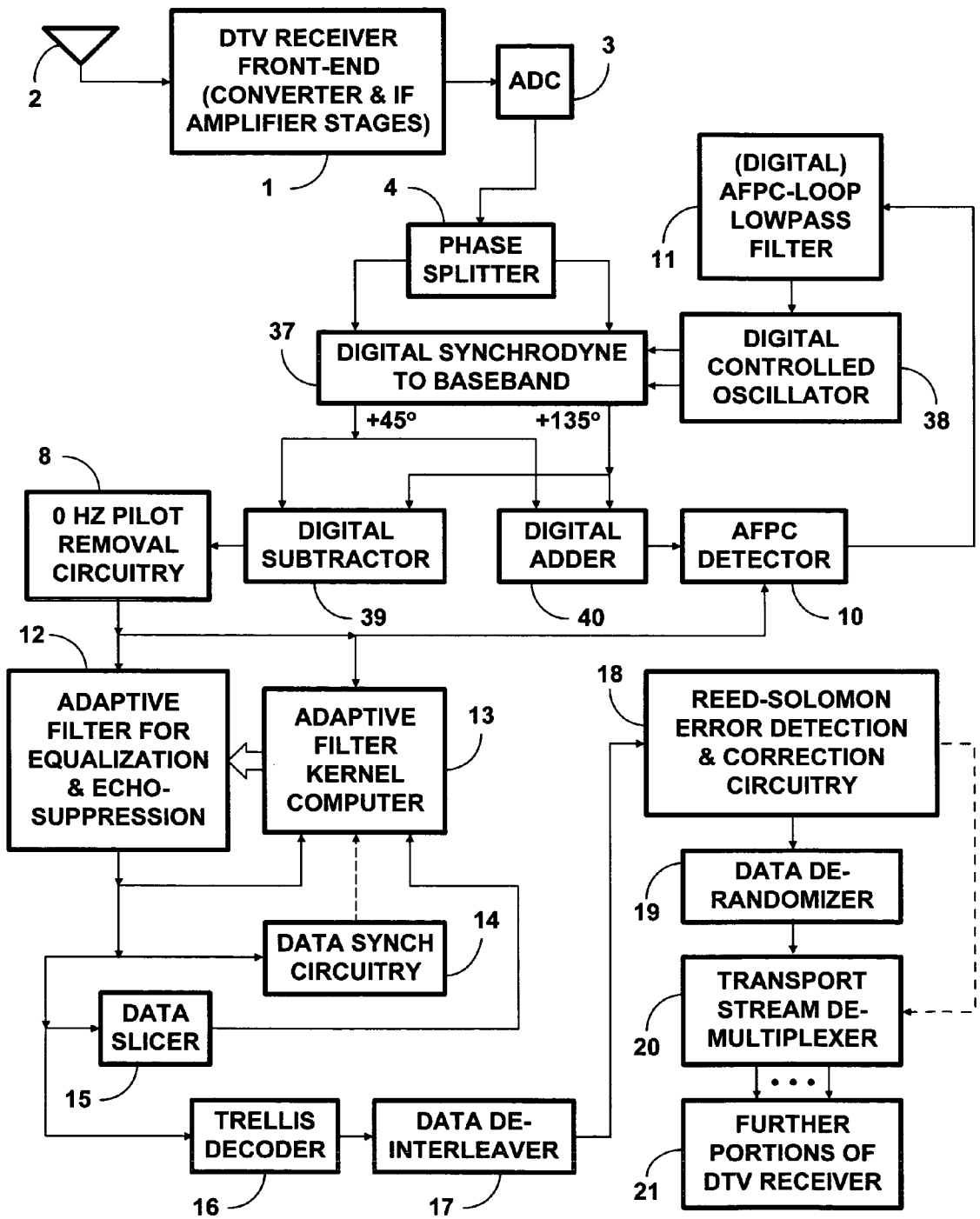
FIG. 3 is a schematic diagram of a DTV signal receiver that uses baseband channel-equalization and echo-suppression filtering, and that includes synchrodyning apparatus embodying an aspect of the invention.

FIG. 3 shows a DTV signal receiver that differs from the FIG. 1 DTV signal receiver in the following respects. The synchrodyning apparatus 5 demodulating at $-45°$ and $+45°$ phasings respective to the pilot carrier is replaced by synchrodyning apparatus 37 demodulating at $+45°$ and $+135°$ phasings respective to the pilot carrier. Accordingly, the baseband signals resulting from synchronous detection have anti-phase real components and have similar imaginary components. The DCO 6 is replaced by a digital controlled oscillator 38 that supplies respective cos $[\omega_C t+(\pi/4)]$ and cos $[\omega_C t+(3\pi/4)]$ components of complex carriers to be used for synchrodyning the complex digitized IF signal from the phase splitter 4. The adder 7 and the subtractor 9 are not included in the FIG. 3 DTV signal receiver. A digital subtractor 39 is connected for differentially combining the baseband signals obtained from synchronously detecting at $+45°$ and $+135°$ phasings respective to the pilot carrier. The difference output signal from the digital subtractor 39 is essentially a real baseband DTV signal, corresponding to the essentially real baseband signal that would be obtained from synchronously detecting at $0°$ phasing respective to the pilot carrier. During favorable reception conditions this essentially real baseband signal reproduces the succession of digital symbols used to modulate the 8VSB DTV RF signal. The 0 Hz pilot removal circuitry 8 is connected for receiving this essentially real baseband DTV signal as its input signal. A digital adder 40 is connected for additively combining the baseband signals obtained from synchronously detecting at $+45°$ and $+135°$ phasings respective to the pilot carrier. The sum output signal from the digital adder 40 corresponds to the essentially imaginary baseband DTV signal that would result from synchronously detecting at 90° phasing respective to the pilot carrier. The adder 40 is connected to supply its sum output signal to the AFPC detector 10.

Figure 4:
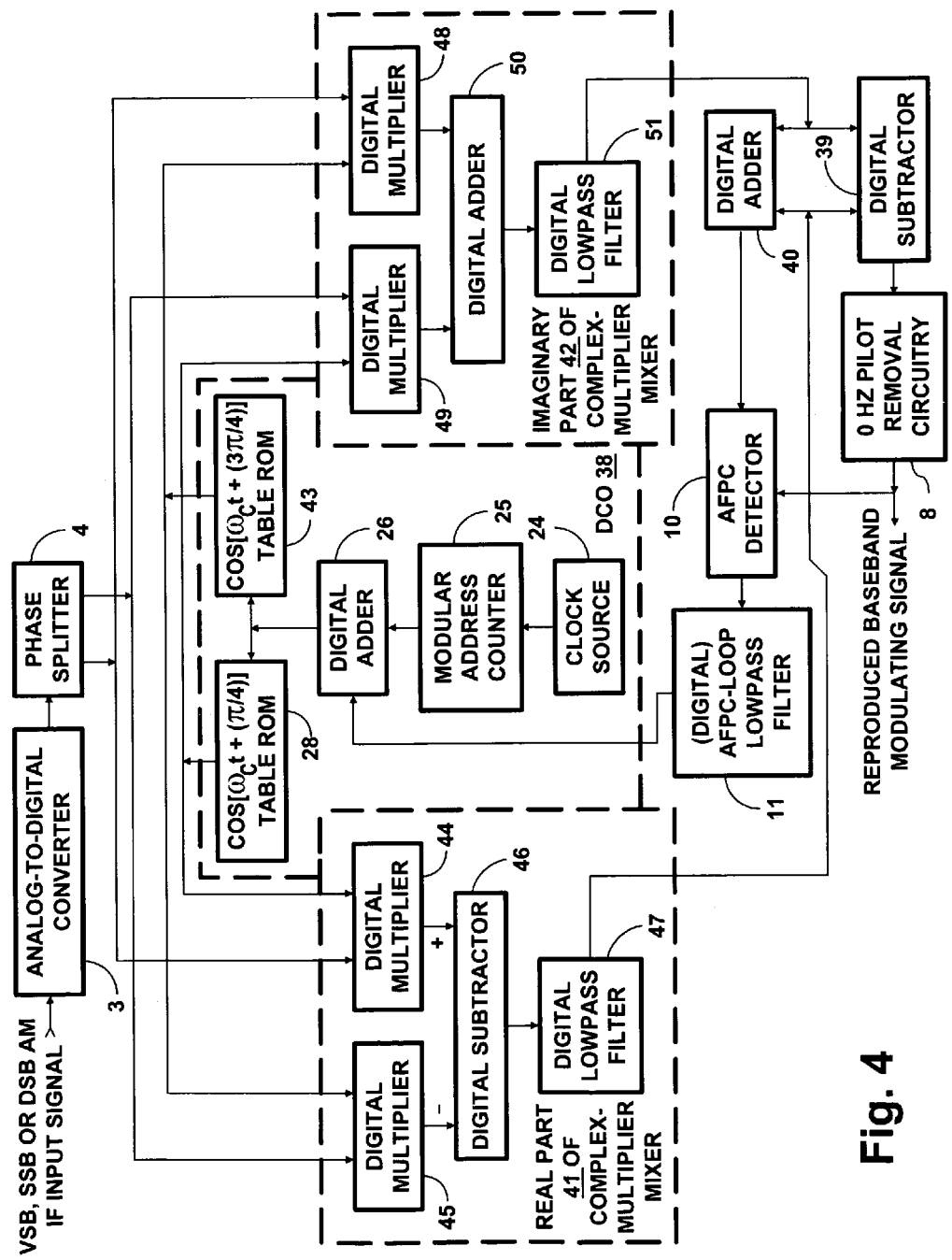
FIG. 4 is a schematic diagram of the synchrodyning apparatus used in the FIG. 3 DTV signal receiver.

FIG. 4 shows in more detail the synchrodyning apparatus 37 used in the FIG. 3 DTV signal receiver for performing a digital synchrodyne to baseband. The FIG. 4 synchrodyning apparatus comprises a real part 41 and an imaginary part 42 of a complex-multiplier mixer connected for multiplying the complex IF input signal by complex carrier signals supplied from the DCO 38. (Note that the terms "real" and "imaginary" are referenced to axes shifted +45° respective to 0° carrier when applied to parts 41 and 42 of the complex-multiplier mixer or to its operations.) The digital subtractor 39 differentially combines the mixer 41 output signal and the mixer 42 output signal to generate its difference output signal, which is supplied to the pilot removal circuitry 8. The pilot removal circuitry 8 reproduces the baseband modulating signal of the VSB, SSB or DSB AM received signal supplied at IF to the ADC 3. The digital adder 40 additively combines the mixer 41 output signal and the mixer 42 output signal to generate its sum output signal, which is used in the generation of AFPC signal for the DCO 38.

The DCO 38 differs from the DCO 6 in that the DCO 38 includes a ROM 43 for generating a carrier wave with a nominal value of cos $[\omega_C t+(3\pi/4)]$ in response to the adder 26 output signal that the ROM 43 receives as input addressing. The DCO 38 also differs from the DCO 6 in not including the ROM 27 for generating a carrier wave with a nominal value of cos $[\omega_C t-(\pi/4)]$. The FIG. 4 synchrodyning apparatus comprises a real part 41 and an imaginary part 42 of a complex-multiplier mixer connected for multiplying the complex IF input signal by complex carrier signals supplied from the DCO 38. The complex-multiplier mixer multiplies the complex IF input signal of form A+jB supplied by the phase splitter 4 by a complex carrier wave of form C+jD to generate a complex product of the form (AC−BD)+j(AD+BC). The C and D terms of the complex carrier wave are supplied by the ROM 28 and by the ROM 43, respectively.

The real part 41 of the complex-multiplier mixer comprises digital multipliers 44 and 45, a digital subtractor 46 and a digital lowpass filter 47. The AC partial product is generated by the digital multiplier 44 multiplying the real component of the complex IF input signal by the carrier wave nominally of value cos $[\omega_C t+(\pi/4)]$. The BD partial product is generated by the digital multiplier 45 multiplying the imaginary component of the complex IF input signal by the carrier wave nominally of value cos $[\omega_C t+(3\pi/4)]$. The digital subtractor 46 is connected for differentially combining the AC and BD partial products generated by the digital multipliers 44 and 45. The digital lowpass filter 47 is connected for responding to the baseband portion of the AC−BD difference output signal from the digital subtractor 46, but not the image portion of that signal. The filter 47 response provides the output signal of the real part 41 of the complex-multiplier mixer.

The imaginary part 42 of the complex-multiplier mixer comprises digital multipliers 48 and 49, a digital adder 50 and a digital lowpass filter 51. The AD partial product is generated by the digital multiplier 48 multiplying the real component of the complex IF input signal by the carrier wave nominally of value cos $[\omega_C t+(3\pi/4)]$. The BC partial product is generated by the digital multiplier 49 multiplying the imaginary component of the complex IF input signal by the carrier wave nominally of value cos $[\omega_C t+(\pi/4)]$. The digital adder 50 is connected for additively combining the AD and BC partial products generated by the digital multipliers 48 and 49. The digital lowpass filter 51 is connected for responding to the baseband portion of the AD+BC sum output signal from the digital adder 50, but not the image portion of that signal. The filter 51 response provides the output signal of the imaginary part 42 of the complex-multiplier mixer.

Figure 5:
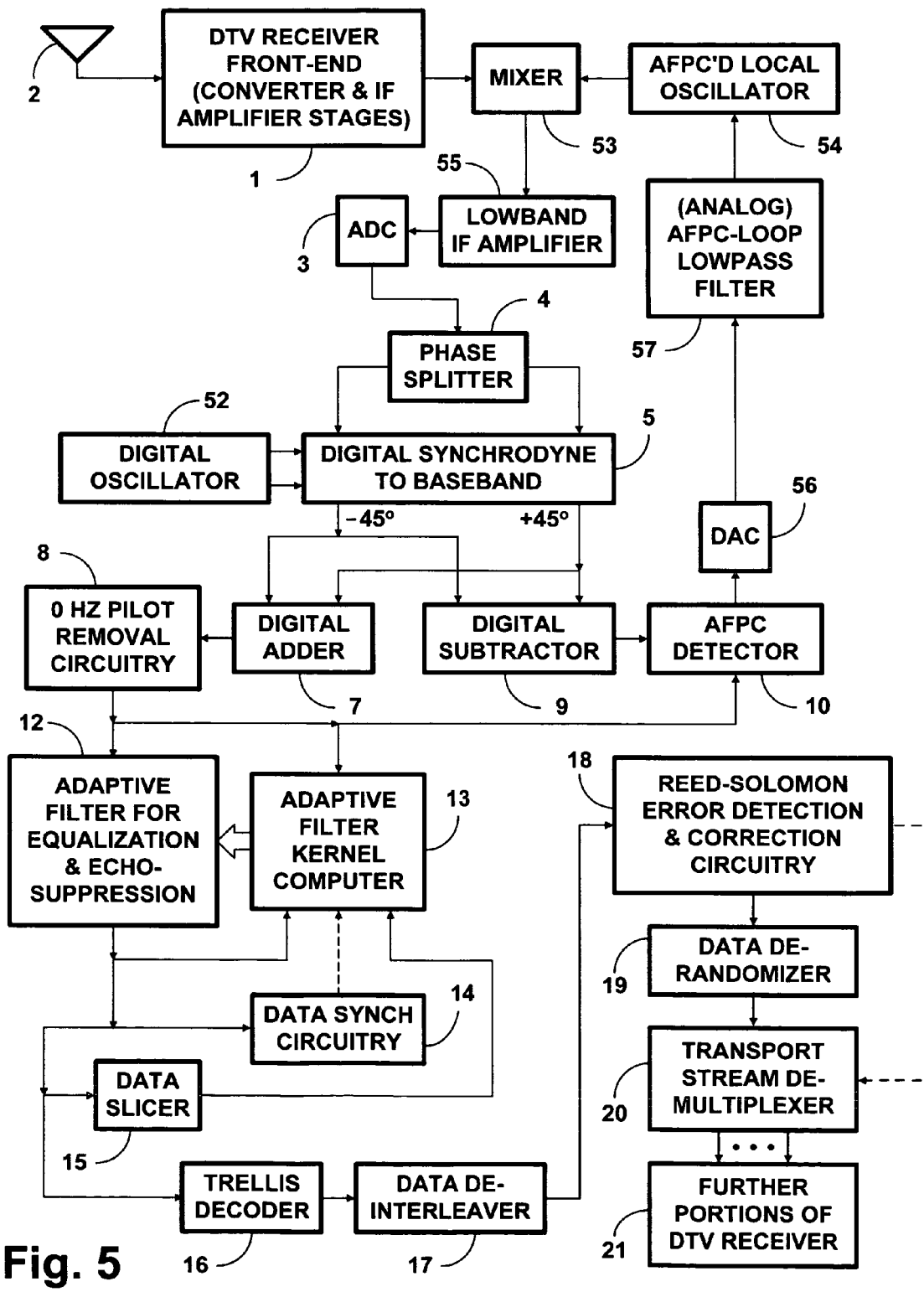
FIG. 5 is a schematic diagram of a DTV signal receiver that uses baseband channel-equalization and echo-suppression filtering, and that includes synchrodyning apparatus embodying an aspect of the invention, which synchrodyning apparatus is a variant of that used in the FIG. 1 DTV signal receiver.

FIG. 5 shows a DTV signal receiver differing from that shown in FIG. 1 in that the DCO 6 is replaced by a digital oscillator 52 for supplying cos $[\omega_C t-(\pi/4)]$ and cos $[\omega_C t+(\pi/4)]$ components of a complex carrier wave of a prescribed angular frequency $\omega_C$ which the synchrodyning apparatus 5 uses for synchronously detecting the complex digitized IF signal from the phase splitter 4. In the FIG. 5 DTV signal receiver the front-end 1 is connected for supplying a mixer 53 an amplified IF DTV signal responsive to RF DTV signal supplied thereto from an antenna 2. The mixer 53 is connected for multiplicatively mixing the amplified IF DTV signal with oscillations from a local oscillator 54, the frequency and phase of which oscillations are controlled by an AFPC signal, to generate a lowband IF DTV signal. A lowband IF amplifier 55 is connected for receiving the lowband IF DTV signal and responding thereto with an amplified lowband IF DTV signal separated from accompanying image signal. In FIG. 5 the analog-to-digital converter 3 is connected for digitizing the amplified lowband IF DTV signal for application to the phase splitter 4 as input signal thereto. The elements 4-10 and 12-21 in the FIG. 5 DTV signal receiver operate substantially the same as in the FIG. 1 DTV signal receiver. The output signal from the AFPC detector 10 is converted to analog form by a digital-to-analog converter (DAC) 56. An analog AFPC-loop lowpass filter 57 is connected for receiving, as its input signal, the digitized output signal from the DAC 56. The lowpass filter 57 is connected for supplying its response as an analog AFPC signal for the local oscillator 54.

Figure 6:
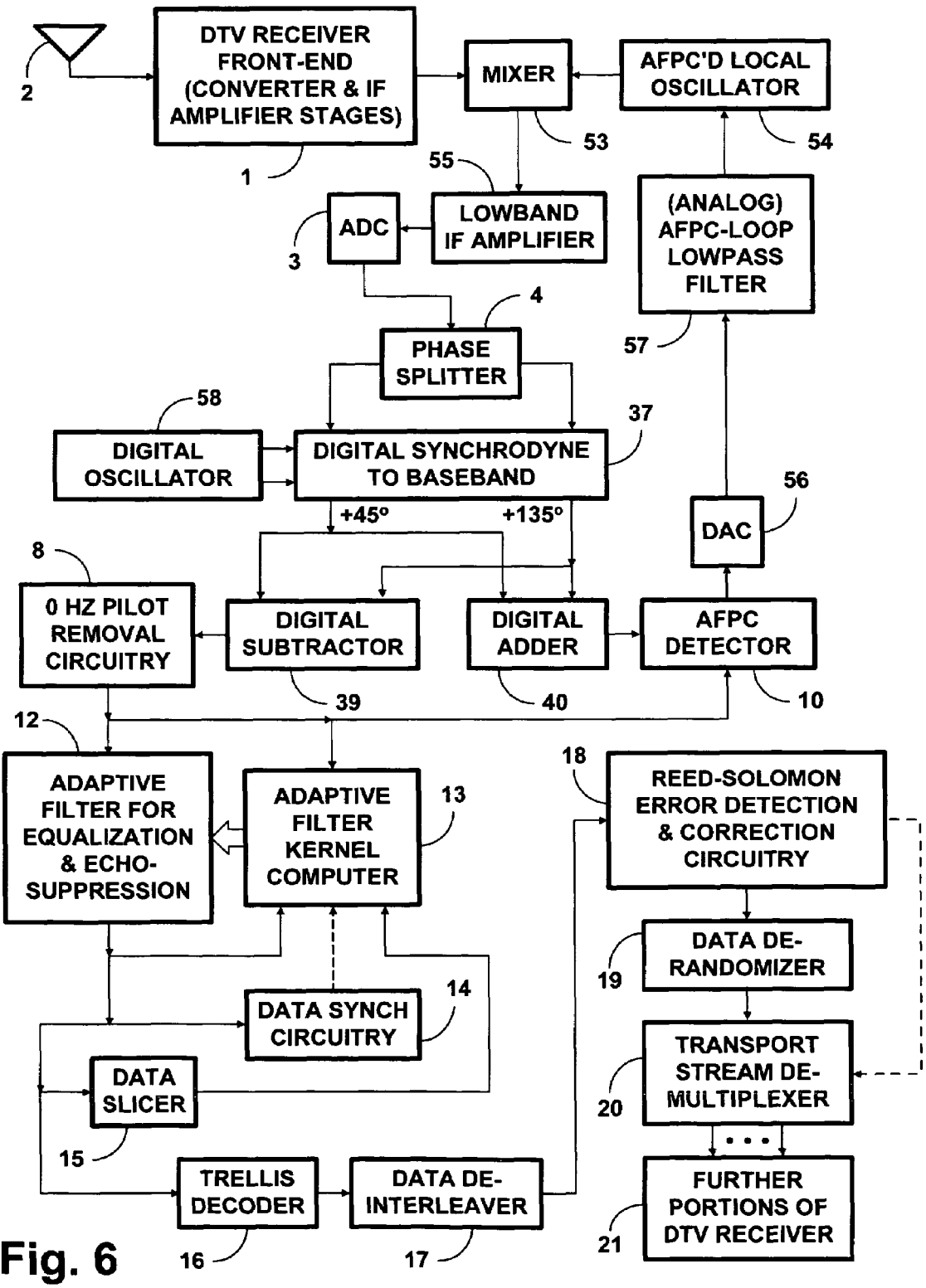
FIG. 6 is a schematic diagram of a DTV signal receiver that that uses baseband channel-equalization and echo-suppression filtering, and includes synchrodyning apparatus embodying an aspect of the invention, which synchrodyning apparatus is a variant of that used in the FIG. 3 DTV signal receiver.

FIG. 6 shows a DTV signal receiver differing from that shown in FIG. 3 in that the DCO 38 is replaced by a digital oscillator 58 for supplying cos $[\omega_C t+(\pi/4)]$ and cos $[\omega_C t+(\pi/4)]$ components of a complex carrier wave of a prescribed angular frequency $\omega_C$ which the synchrodyning apparatus 37 uses for synchronously detecting the complex digitized IF signal from the phase splitter 4. In the FIG. 6 DTV signal receiver the front-end 1 is connected for supplying the mixer 53 an amplified IF DTV signal responsive to RF DTV signal supplied thereto from an antenna 2. The mixer 53 is connected for multiplicatively mixing the amplified IF DTV signal with oscillations from the local oscillator 54, the frequency and phase of which oscillations are controlled by an AFPC signal, to generate a lowband IF DTV signal. The lowband IF amplifier 55 is connected for receiving the lowband IF DTV signal and responding thereto with an amplified lowband IF DTV signal separated from accompanying image signal. In FIG. 6 the analog-to-digital converter 3 is connected for digitizing the amplified lowband IF DTV signal for application to the phase splitter 4 as input signal thereto. The elements 4, 37, 39, 40, 8, 10 and 12-21 in the FIG. 6 DTV signal receiver operate substantially the same as in the FIG. 3 DTV signal receiver. The output signal from the AFPC detector 10 is converted to analog form by the digital-to-analog converter (DAC) 56. The analog AFPC-loop lowpass filter 57 is connected for receiving, as its input signal, the digitized output signal from the DAC 56. The lowpass filter 57 is connected for supplying its response as an analog AFPC signal for the local oscillator 54.

Figure 7:
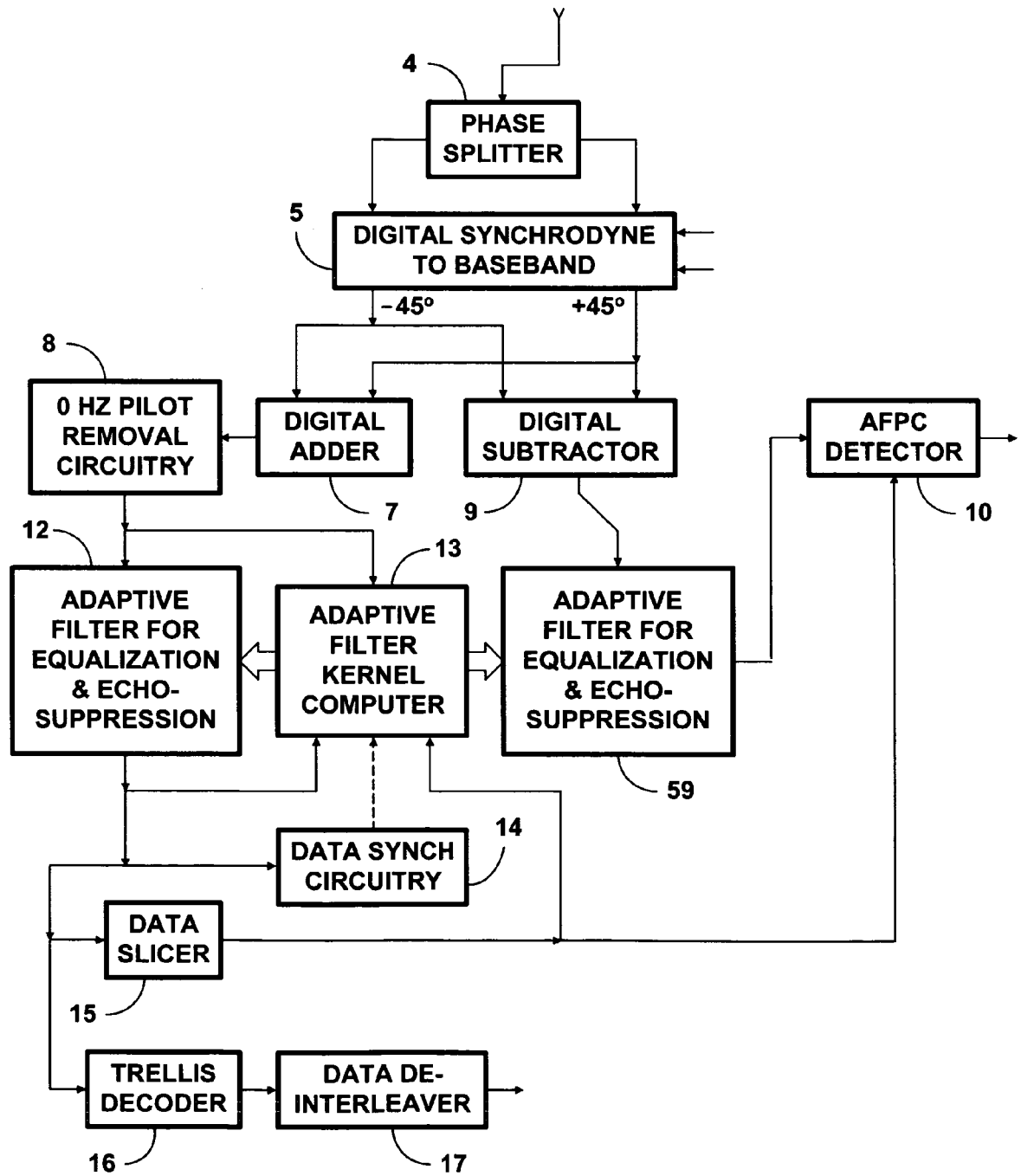
FIG. 7 is a schematic diagram showing a modification of the FIG. 1 or FIG. 5 DTV signal receiver in which imaginary as well as real baseband DTV signal is provided with channel-equalization and echo suppression filtering.

FIG. 7 shows a modification of the FIG. 1 DTV signal receiver or of the FIG. 5 DTV signal receiver, in which modification an adaptive filter 59 is connected to provide channel-equalization and echo suppression filtering to the difference output signal from the digital subtractor 9. The weighting coefficients in the kernel of the adaptive filter 59 are adjusted by the computer 13 similarly to the adjustments of the weighting coefficients in the kernel of the adaptive filter 12. FIG. 7 shows the response of the adaptive filter 59 and the response of the data slicer 15 being applied to the AFPC detector 10, rather than the difference output signal from the subtractor 9 and the response of the adaptive filter 12 being so applied as shown in FIGS. 1 and 5.

Figure 8:
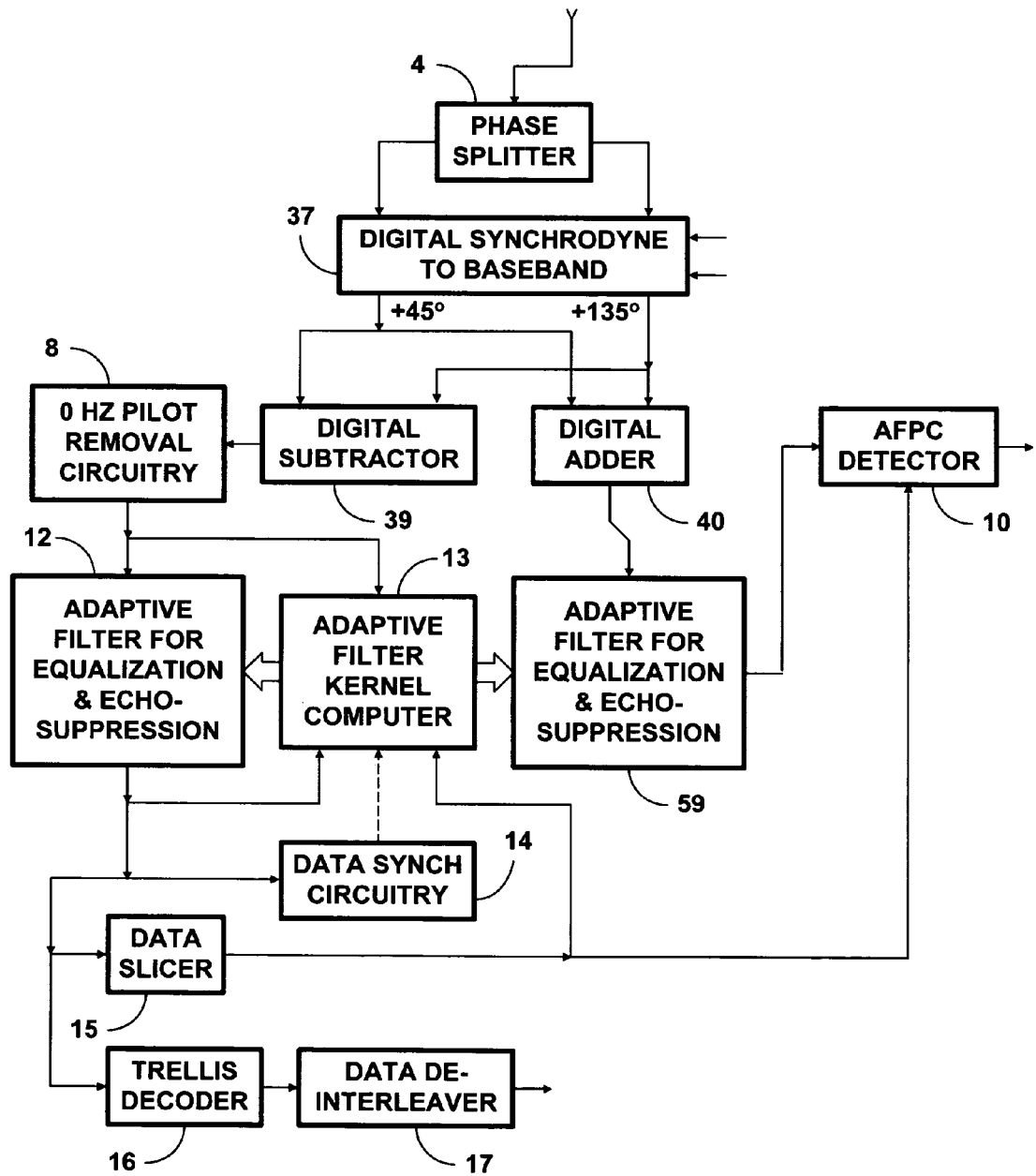
FIG. 8 is a schematic diagram showing a modification of the FIG. 3 or FIG. 6 DTV signal receiver in which imaginary as well as real baseband DTV signal is provided with channel-equalization and echo suppression filtering.

FIG. 8 shows a modification of the FIG. 3 DTV signal receiver or of the FIG. 6 DTV signal receiver, in which modification the adaptive filter 59 is connected to provide channel-equalization and echo suppression filtering to the sum output signal from the digital adder 40. The weighting coefficients in the kernel of the adaptive filter 59 are adjusted by the computer 13 similarly to the adjustments of the weighting coefficients in the kernel of the adaptive filter 12. FIG. 8 shows the response of the adaptive filter 59 and the response of the data slicer 15 being applied to the AFPC detector 10, rather than the sum output signal from the adder 40 and the response of the adaptive filter 12 being so applied as shown in FIGS. 3 and 6.

The FIG. 7 and FIG. 8 modifications tend to reduce tracking error in the AFPC signal developed by an AFPC detector 10 that comprises a digital multiplier for multiplying the real and imaginary baseband DTV signals together. In these modifications the adaptive filter 59 is included within the AFPC loop and introduces additional latent delay into the loop, which can require the loop bandwidth to be kept smaller in order to avoid oscillatory tendencies. Performing channel-equalization and echo-suppression filtering before synchrodyning to baseband avoids including such filtering within the AFPC loop.

Figure 9:
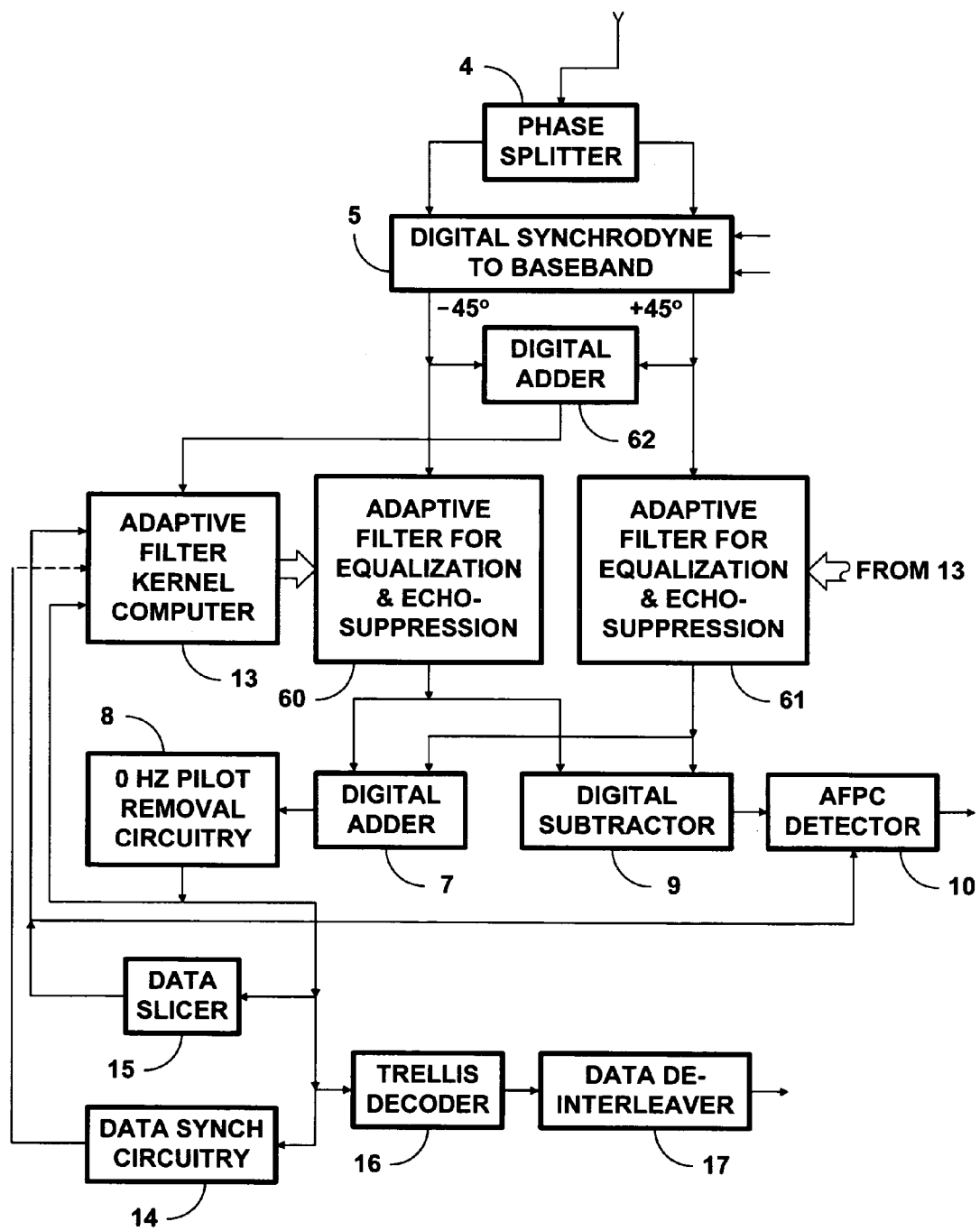
FIG. 9 is a schematic diagram showing a modification of the FIG. 7 DTV signal receiver.

FIG. 9 shows a variant of the FIG. 7 DTV signal receiver. The FIG. 9 DTV signal receivers does not include the adaptive filter 12, but rather applies the response from the pilot removal circuitry 8 directly to the data synchronization circuitry 14, to the data slicer 15 and to the trellis decoder 16. The FIG. 9 DTV signal receiver does not include the adaptive filter 59, but rather applies the difference output signal from the subtractor 9 directly to the AFPC detector 10. The FIG. 9 DTV signal receiver uses adaptive filters 60 and 61 to provide channel-equalization and echo-suppression filtering to respective ones of the baseband DTV signals reproduced by the synchrodyne circuitry 5. The computer 13 is connected for adjusting the weighting coefficients in the kernel of the adaptive filter 60 and for adjusting the weighting coefficients in the kernel of the adaptive filter 61 in similar manner. The responses of the adaptive filters 60 and 61 are each applied as a respective input signal to the adder 7 and a respective input signal to the subtractor 9. A digital adder 62 is connected for additively combining the baseband DTV signals reproduced by the synchrodyne circuitry 5 to recover a real baseband DTV signal as a sum output signal supplied to the computer 13. Responsive to control signals from the data synchronization circuitry 14, the computer 13 responds to data field synchronizing signal in the adder 62 sum output signal to initialize the weighting coefficients in the kernels of the adaptive filters 60 and 61.

Figure 10:
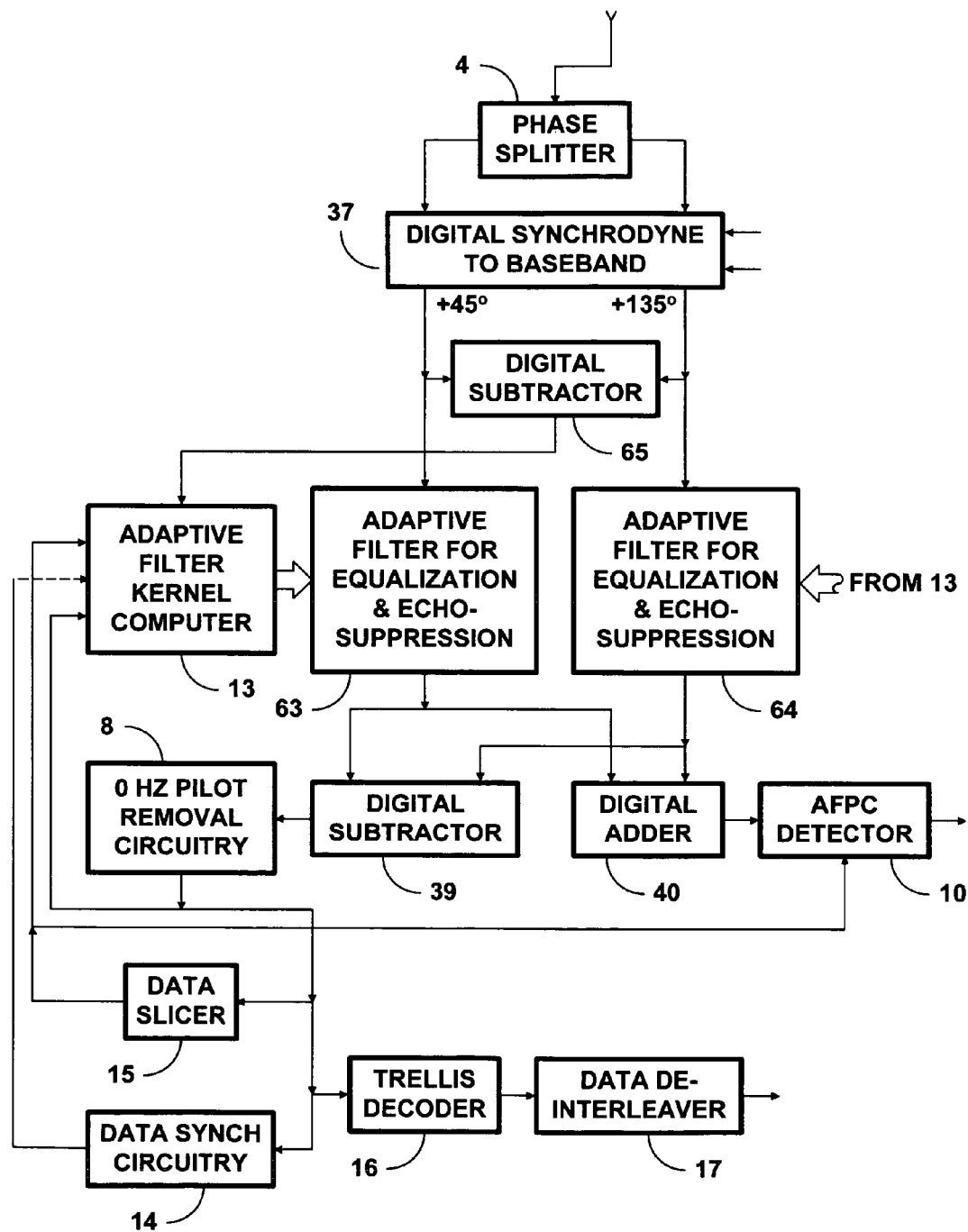
FIG. 10 is a schematic diagram showing a modification of the FIG. 8 DTV signal receiver.

FIG. 10 shows a variant of the FIG. 8 DTV signal receiver. The FIG. 10 DTV signal receivers does not include the adaptive filter 12, but rather applies the response from the pilot removal circuitry 8 directly to the data synchronization circuitry 14, to the data slicer 15 and to the trellis decoder 16. The FIG. 10 DTV signal receiver does not include the adaptive filter 59, but rather applies the sum output signal from the adder 40 directly to the AFPC detector 10. The FIG. 10 DTV signal receiver uses the adaptive filters 63 and 64 to provide channel-equalization and echo-suppression filtering to respective ones of the baseband DTV signals reproduced by the synchrodyne circuitry 37. The computer 13 is connected for adjusting the weighting coefficients in adaptive filter 63 and for adjusting the weighting coefficients in the kernel of the adaptive filter 64 in similar manner. The responses of the adaptive filters 63 and 64 are each applied as a respective input signal to the subtractor 39 and a respective input signal to the adder 40. A digital subtractor 65 is connected for differentially combining the baseband DTV signals reproduced by the synchrodyne circuitry 37 to recover a real baseband DTV signal as a difference output signal supplied to the computer 13. Responsive to control signals from the data synchronization circuitry 14, the computer 13 responds to data field synchronizing signal in the subtractor 65 difference output signal to initialize the weighting coefficients in the kernels of the adaptive filters 63 and 64.

Figure 11:
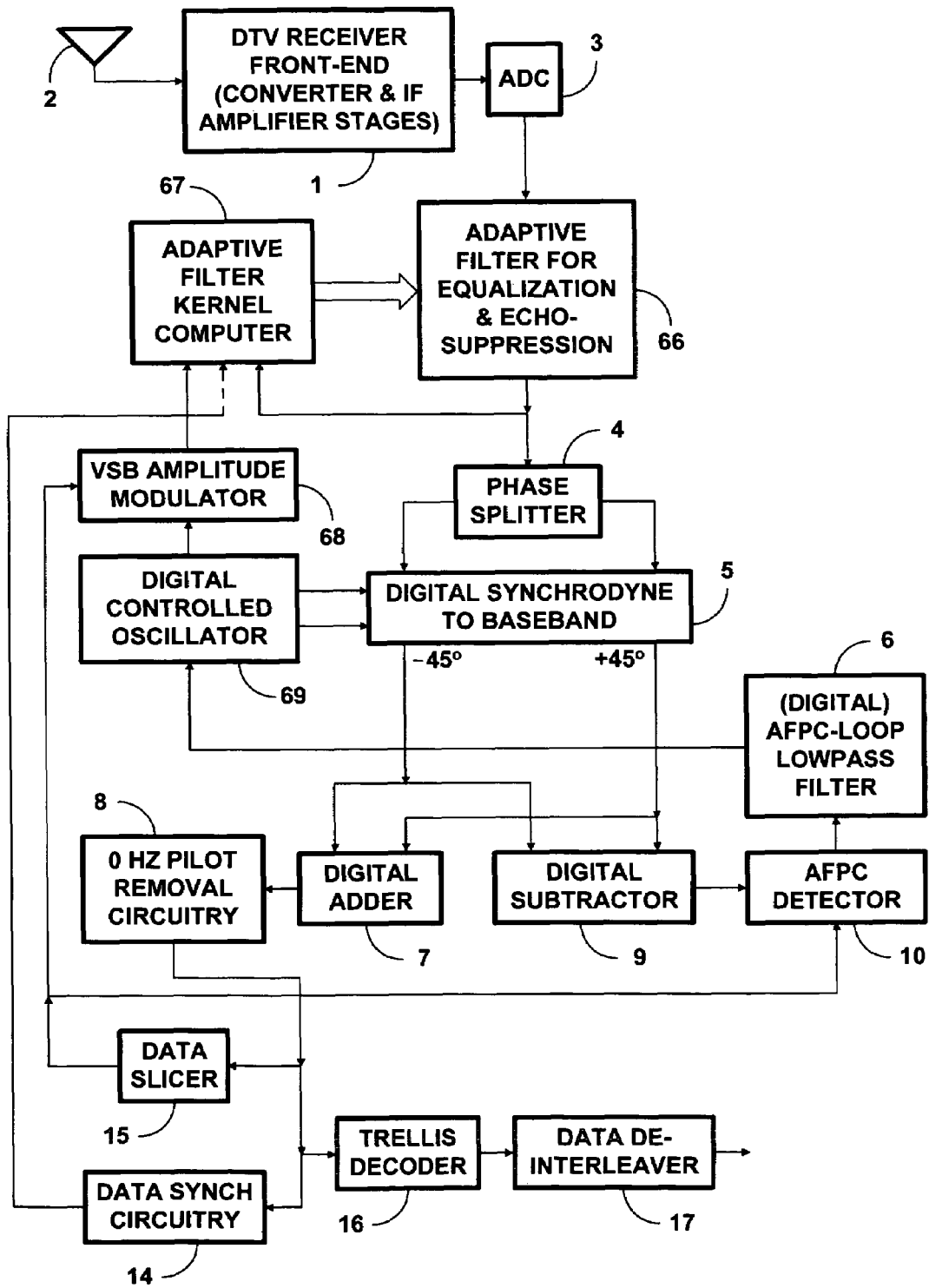
FIG. 11 is a schematic diagram of a DTV signal receiver that uses passband channel-equalization and echo-suppression filtering, and that includes synchrodyning apparatus of the sort shown in FIG. 2.
Figure 12:
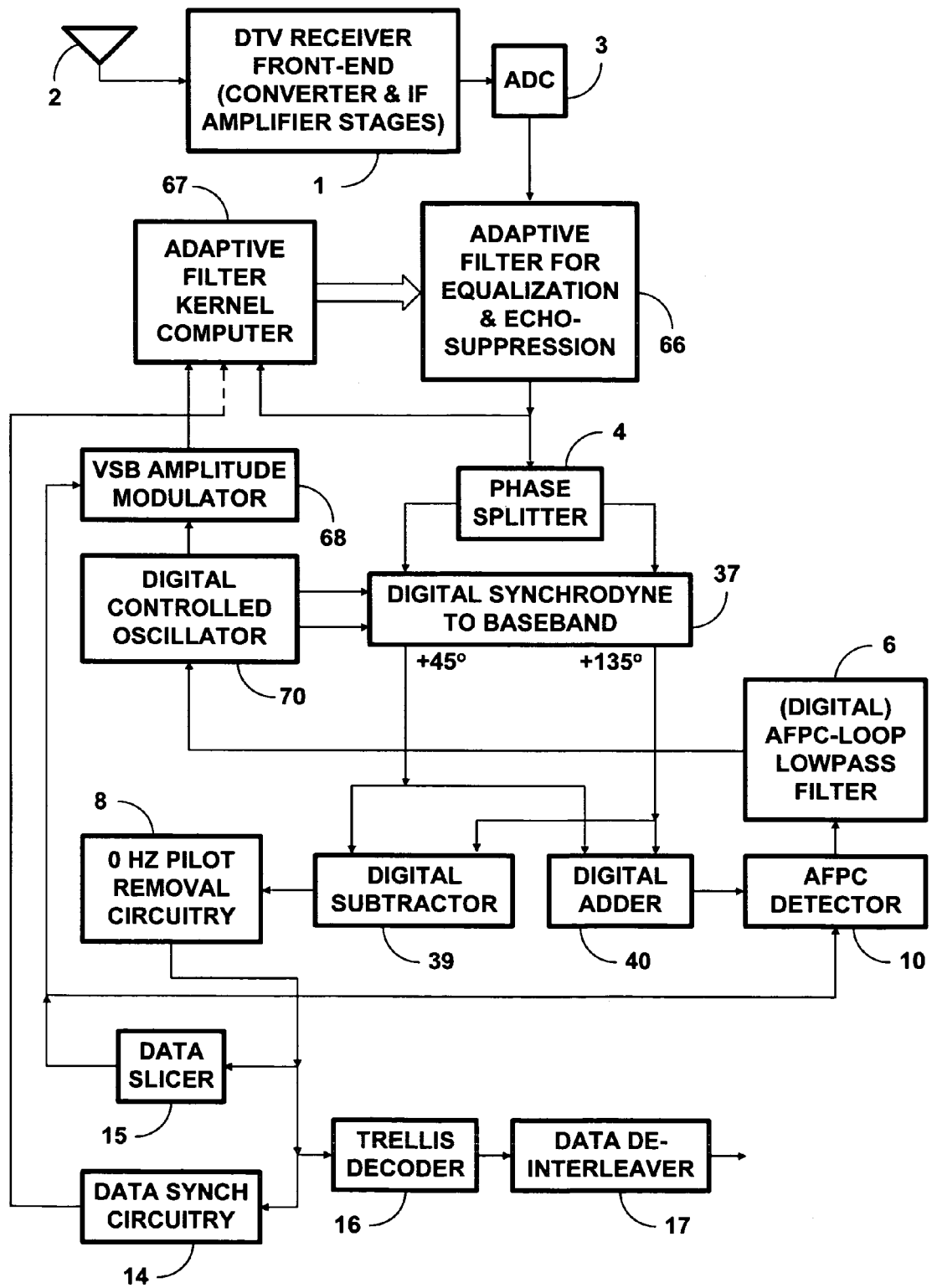
FIG. 12 is a schematic diagram of a DTV signal receiver that uses passband channel-equalization and echo-suppression filtering, and that includes synchrodyning apparatus of the sort shown in FIG. 4.
Figure 13:
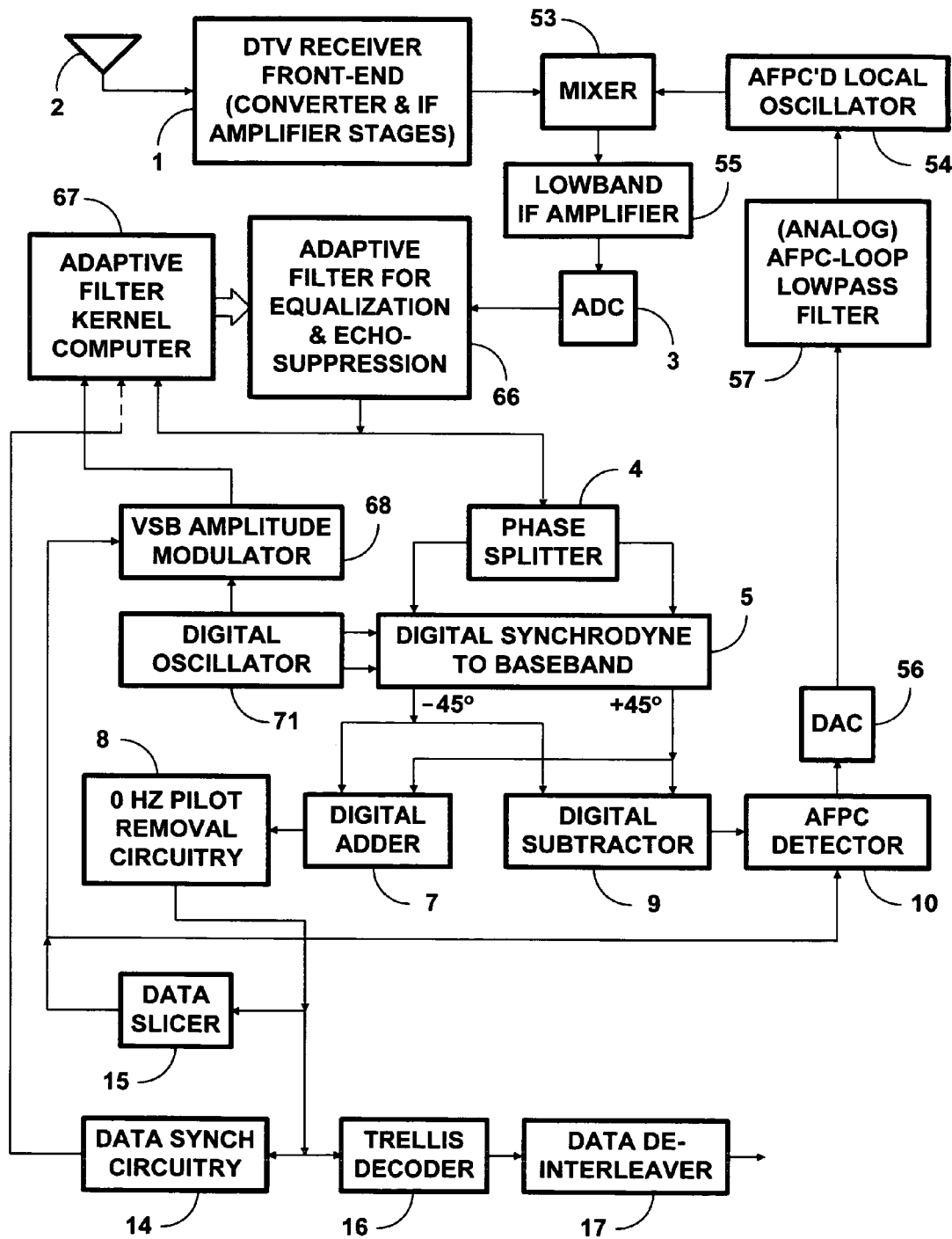
FIG. 13 is a schematic diagram of a DTV signal receiver that uses passband channel-equalization and echo-suppression filtering, and that includes synchrodyning apparatus embodying an aspect of the invention, which synchrodyning apparatus similar to that used in the FIG. 5 DTV signal receiver.
Figure 14:
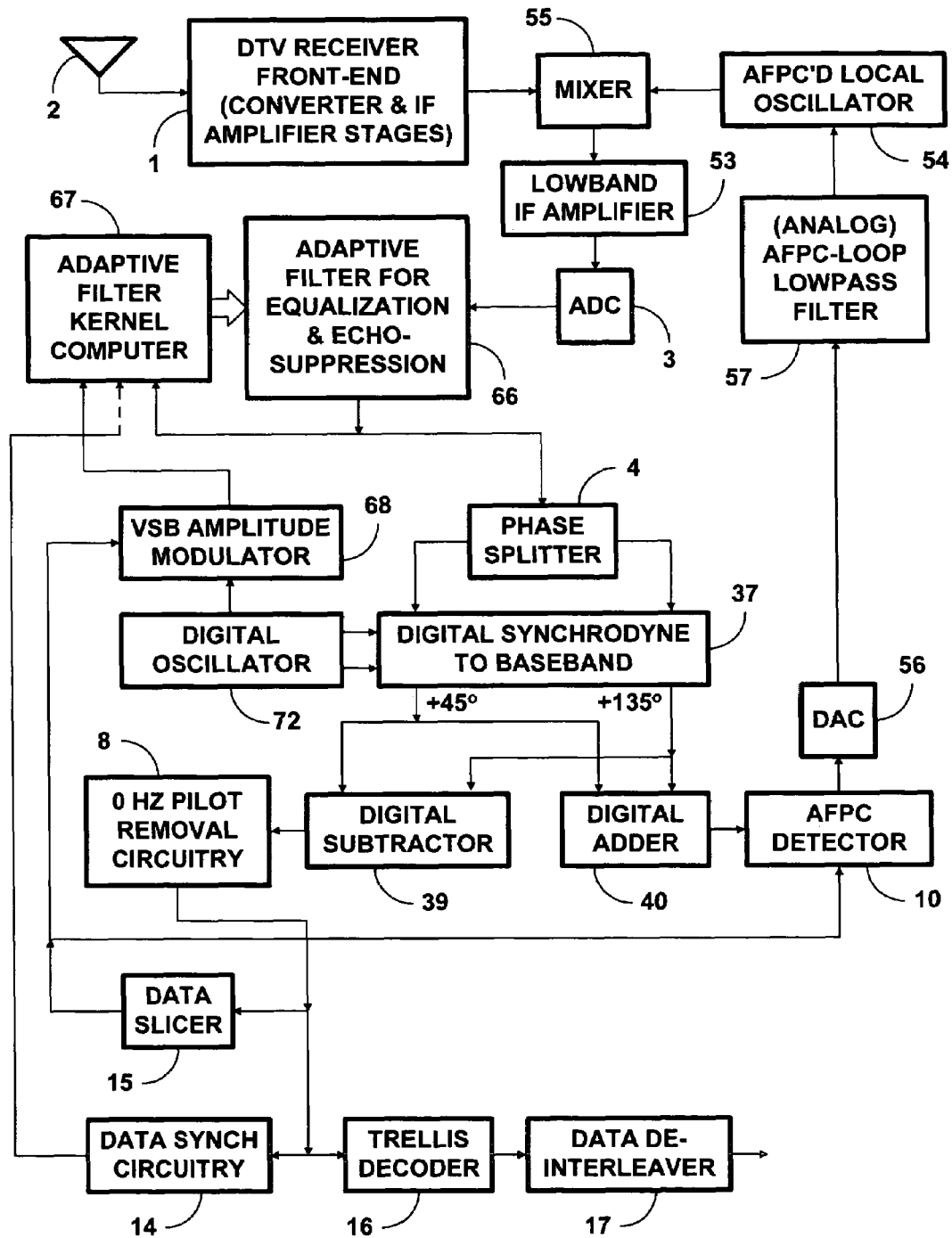
FIG. 14 is a schematic diagram is a schematic diagram of a DTV signal receiver that uses passband channel-equalization and echo-suppression filtering, and that includes synchrodyning apparatus embodying an aspect of the invention, which synchrodyning apparatus similar to that used in the FIG. 6 DTV signal receiver.

FIG. 11 shows a modification of the FIG. 1 DTV signal receiver to perform channel-equalization and echo-suppression filtering before synchrodyning to baseband. FIG. 12 shows a modification of the FIG. 3 DTV signal receiver to perform channel-equalization and echo-suppression filtering before synchrodyning to baseband. FIGS. 13 and 14 show similar modifications of the FIG. 5 DTV signal receiver and of the FIG. 6 DTV signal receiver. In these modifications the pilot removal circuitry 8 is connected to apply its baseband DTV signal response directly to the data synchronization circuitry 14, the data slicer 15 and the trellis decoder 16. The adaptive filter 12 for baseband channel-equalization and echo suppression is not used, nor is the computer 13 for computing the weighting coefficient in the kernel of that filtering. An adaptive filter 66 for passband channel-equalization and echo suppression is connected for receiving the IF signal digitized by the ADC 3. The adaptive filter 66 is clocked at a multiple of the baud rate of the 8VSB DTV signal, such as four times baud rate. The phase splitter 4 is connected for receiving as its input signal the adaptive filter 66 response. The phase-splitter 4 takes a form in which the real component of the splitter response has a determinate phase relationship with the IF input signal to the phase-splitter 4. A computer 67 is connected for computing the weighting coefficients of the adaptive filter 66 kernel. The computer 67 bases its computations on error signal it develops by differentially combining the response of the adaptive filter 66 and the response of a vestigial-sideband amplitude modulator 68. The VSB amplitude modulator 68 amplitude modulates a carrier wave of coc angular frequency in accordance with a modulating signal furnished by the data slicer 15. The data slicer 15 is connected for supplying the AFPC detector 10 as well as the VSB amplitude modulator 68 with estimates of the symbols presumed to have been transmitted. These estimates provide an idealized real baseband DTV signal to the AFPC detector 10 that can be used for implementing a Costas-type AFPC loop. The estimates supplied to the VSB amplitude modulator 68 are re-sampled to the sampling rate at which the adaptive filter 66 is clocked. U.S. Pat. No. 6,124,898 titled "DIGITAL TELEVISION RECEIVER WITH EQUALIZATION PERFORMED ON DIGITAL INTERMEDIATE-FREQUENCY SIGNALS" issued 26 Sep. 2000 to C. B. Patel and A. L. R. Limberg. The techniques for passband equalization used in the DTV signal receivers of FIGS. 9, 10, 11 and 12 are based on techniques that this patent describes.

Figure 15:
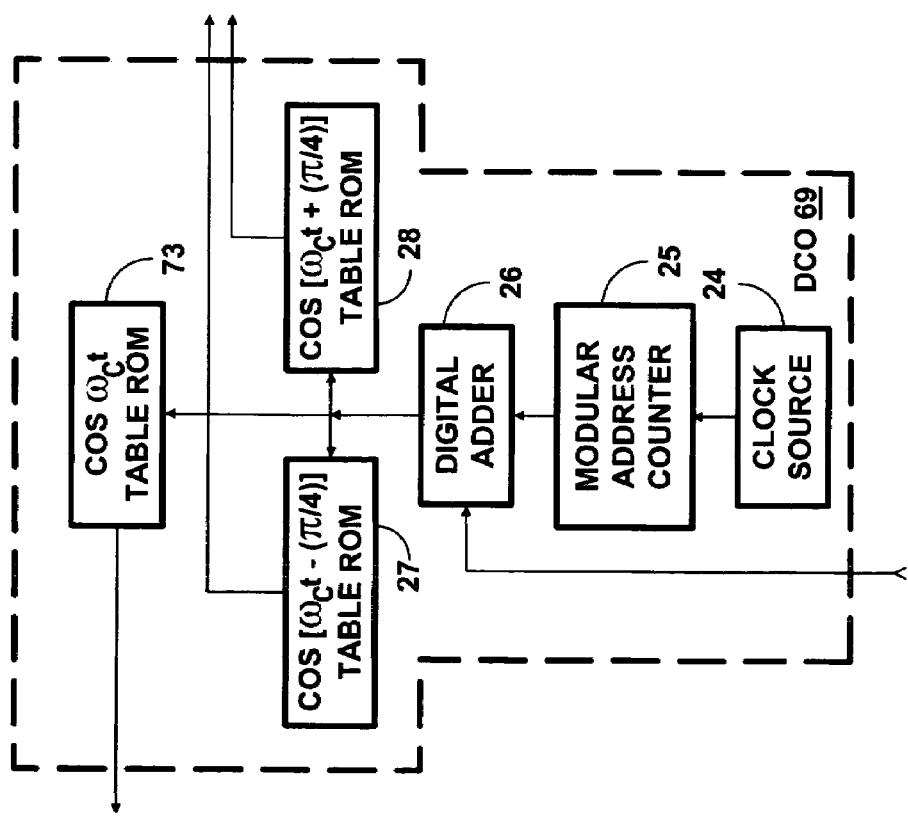
FIG. 15 is a schematic diagram showing in more detail the construction of a digital controlled oscillator used in the FIG. 13 DTV signal receiver.

FIG. 15 shows details of a digital controlled oscillator 69 used in the FIG. 11 DTV signal receiver instead of the DCO 6 for supplying the synchrodyning apparatus 5 with cos $[\omega_C t - (\pi/4)]$ and cos $[\omega_C t + (\pi/4)]$ components of the complex carrier wave of the prescribed angular frequency $\omega_C$. The DCO 69 resembles the DCO 6 except for including a further read-only memory 73 providing a look-up table for the waveform of the carrier wave supplied to the VSB amplitude modulator 68 in the FIG. 11 signal receiver. Nominally, this carrier has a cos $\omega_C t$ waveform, but an angular offset is used to compensate for latency in the synchrodyne of the DTV signal to baseband.

Figure 16:
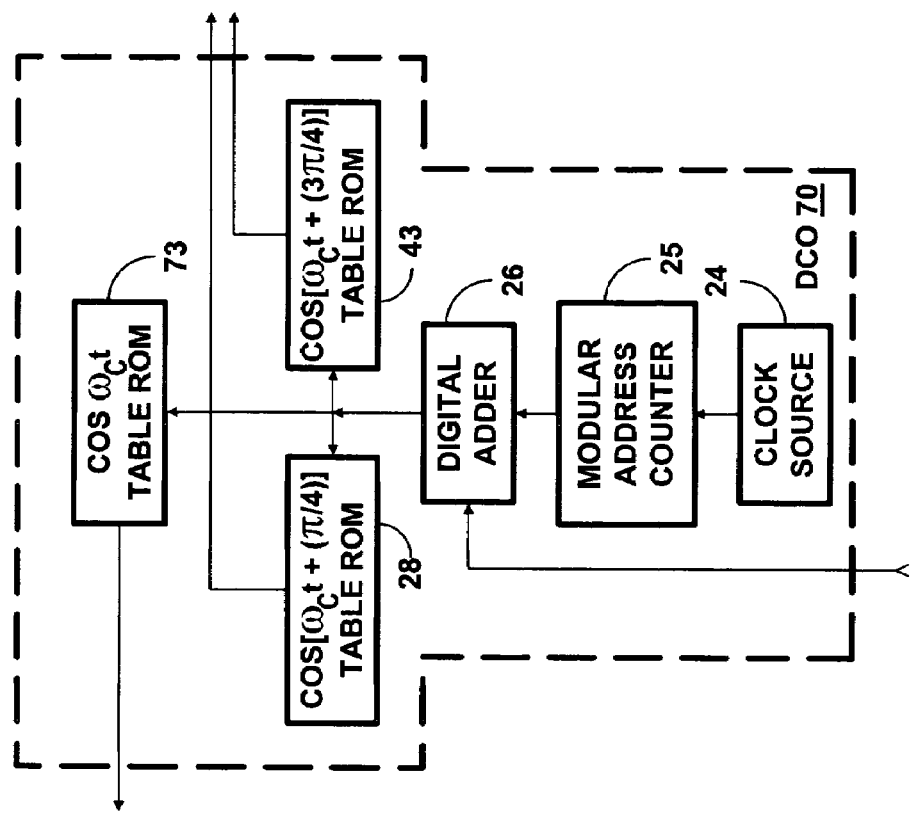
FIG. 16 is a schematic diagram showing in more detail the construction of a digital controlled oscillator used in the FIG. 14 DTV signal receiver.

FIG. 16 shows details of a digital controlled oscillator 70 used in the FIG. 12 DTV signal receiver instead of the DCO 38 for supplying the synchrodyning apparatus 37 with cos $[\omega_C t+(\pi/4)]$ and cos $[(\omega_C t+(3\pi/4)]$ components of the complex carrier wave of the prescribed angular frequency $\omega_C$. The DCO 70 resembles the DCO 38 except for including the further read-only memory 73 providing a look-up table for the waveform of the carrier wave supplied to the VSB amplitude modulator 68 in the FIG. 12 DTV signal receiver.

Instead of the digital oscillator 52 used in the FIG. 5 DTV signal receiver, the FIG. 13 DTV signal receiver uses a digital oscillator 71 for supplying the synchrodyning apparatus 5 with cos $[\omega_C t-(\pi/4)]$ and cos $[\omega_C t+(\pi/4)]$ components of the complex carrier wave of the prescribed angular frequency $\omega_C$. The digital oscillator 71 can be constructed similarly to the DCO 69 of FIG. 15, except for the digital adder 26 being omitted. The address counter 25 is then connected for applying modular addressing directly to the ROMs 27, 28 and 73.

Instead of the digital oscillator 58 used in the FIG. 6 DTV signal receiver, the FIG. 14 DTV signal receiver uses a digital oscillator 72 for supplying the synchrodyning apparatus 5 with cos $[\omega_C t+(\pi/4)]$ and cos $[(\omega_C t+3(\pi/4)]$ components of the complex carrier wave of the prescribed angular frequency $\omega_C$. The digital oscillator 72 can be constructed similarly to the DCO 70 of FIG. 16, except for the digital adder 26 being omitted. The address counter 25 is then connected for applying modular addressing directly to the ROMs 28, 43 and 73.

Figure 17:
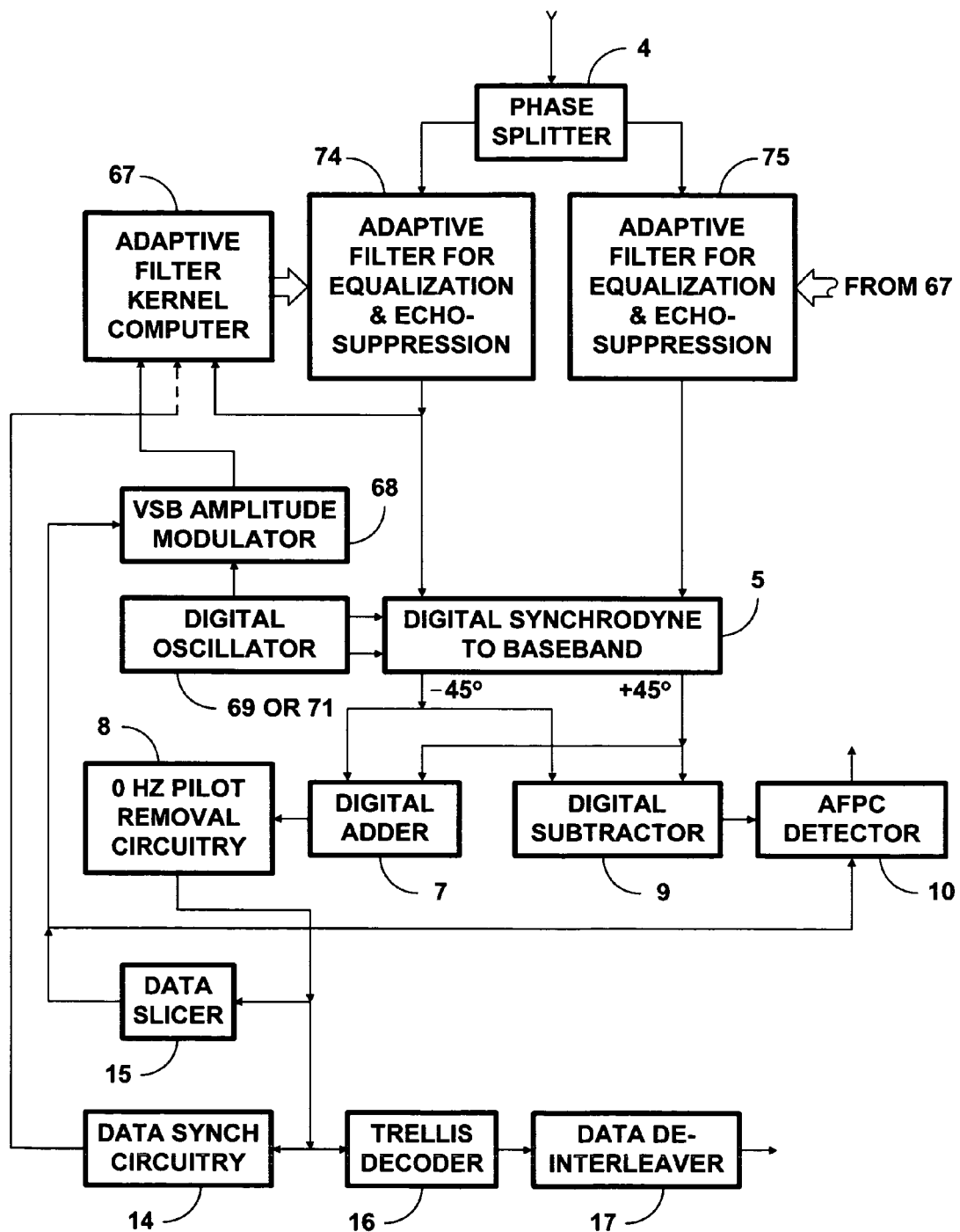
FIG. 17 is a schematic diagram showing a modification of the FIG. 11 or the FIG. 13 DTV signal receiver.
Figure 18:
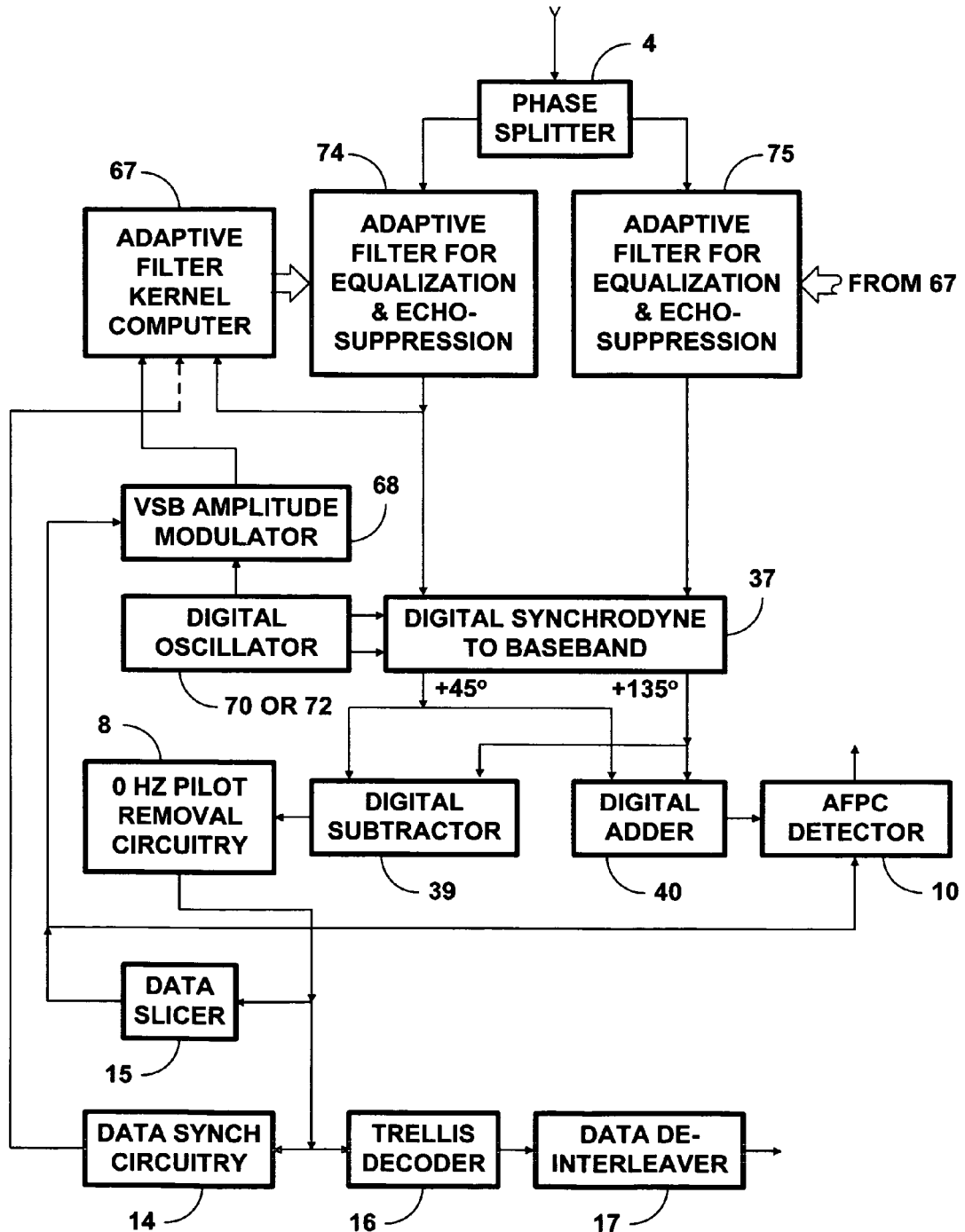
FIG. 18 is a schematic diagram showing a modification of the FIG. 12 or the FIG. 14 DTV signal receiver.

FIG. 17 shows a modification of the FIG. 11 DTV signal receiver or of the FIG. 13 DTV signal receiver, in which modification the adaptive filter 66 for input signal into the phase splitter 4 is replaced by adaptive filters 74 and 75 for the real output signal and for the imaginary output signal respectively from the phase splitter 4. FIG. 18 shows a similar modification of the FIG. 12 DTV signal receiver or of the FIG. 14 DTV signal receiver. The FIGS. 17 and 18 modifications tend to double the amount of filtering used for channel equalization and echo suppression. Accordingly, DTV signal receivers using a single adaptive filter 66 for passband channel equalization and echo suppression are preferred over DTV signal receivers using the pair of adaptive filters 74 and 75.

Figure 19:
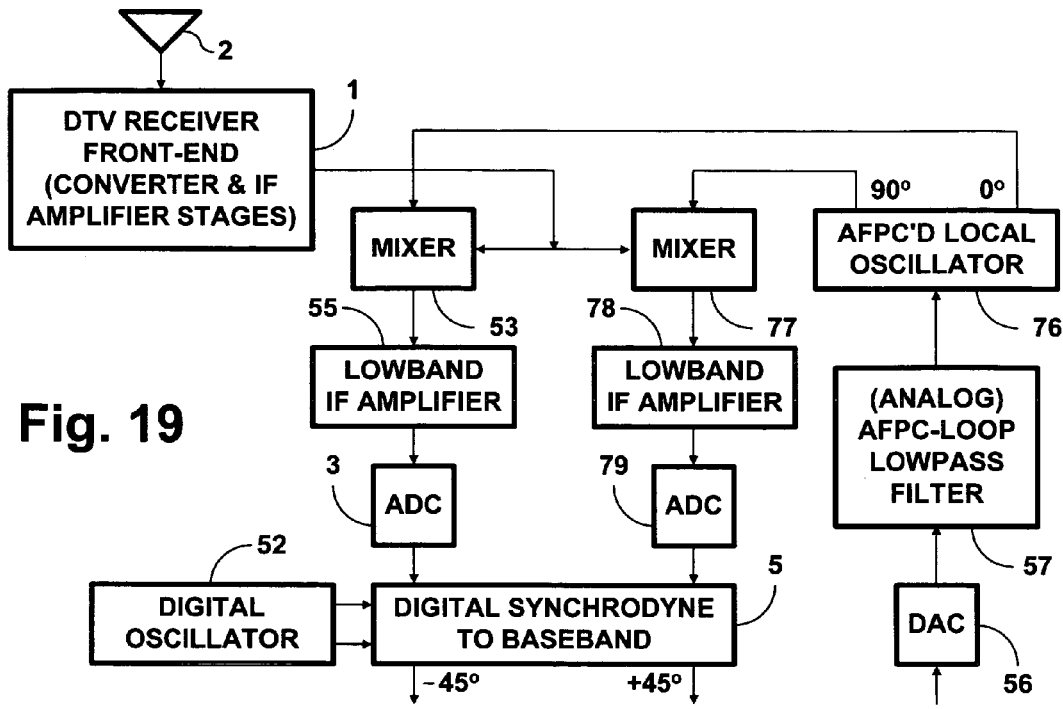
FIG. 19 is a schematic diagram showing a modification that can be made to the FIG. 5 DTV signal receiver or that receiver modified per FIG. 7.
Figure 20:
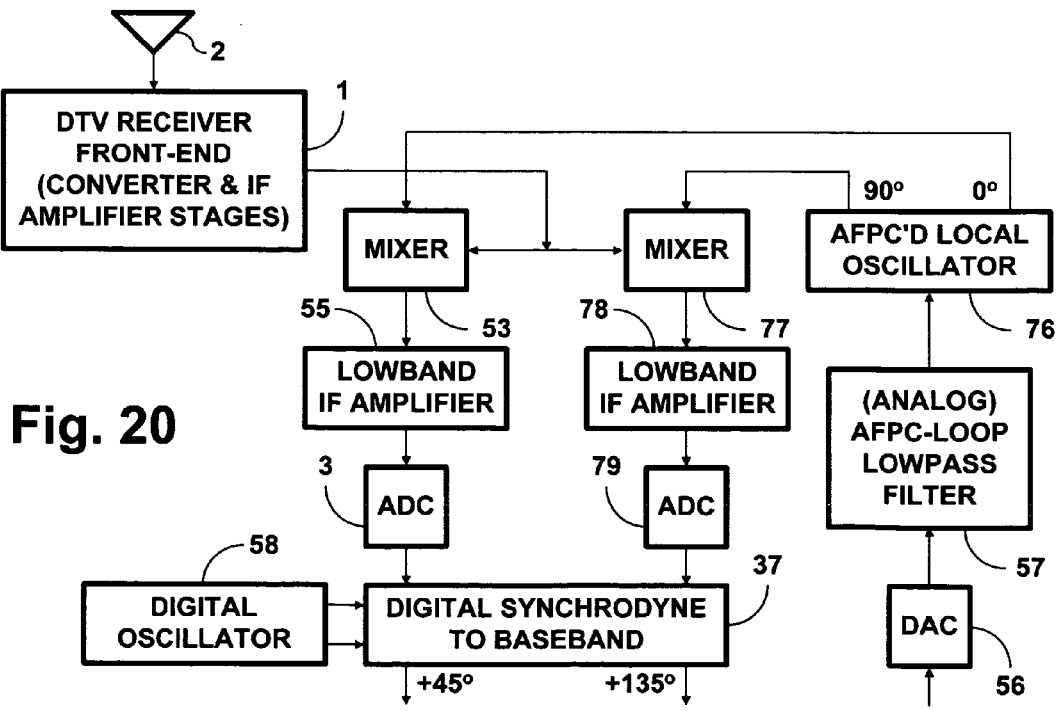
FIG. 20 is a schematic diagram showing a modification that can be made to the FIG. 6 DTV signal receiver or that receiver modified per FIG. 8.
Figure 21:
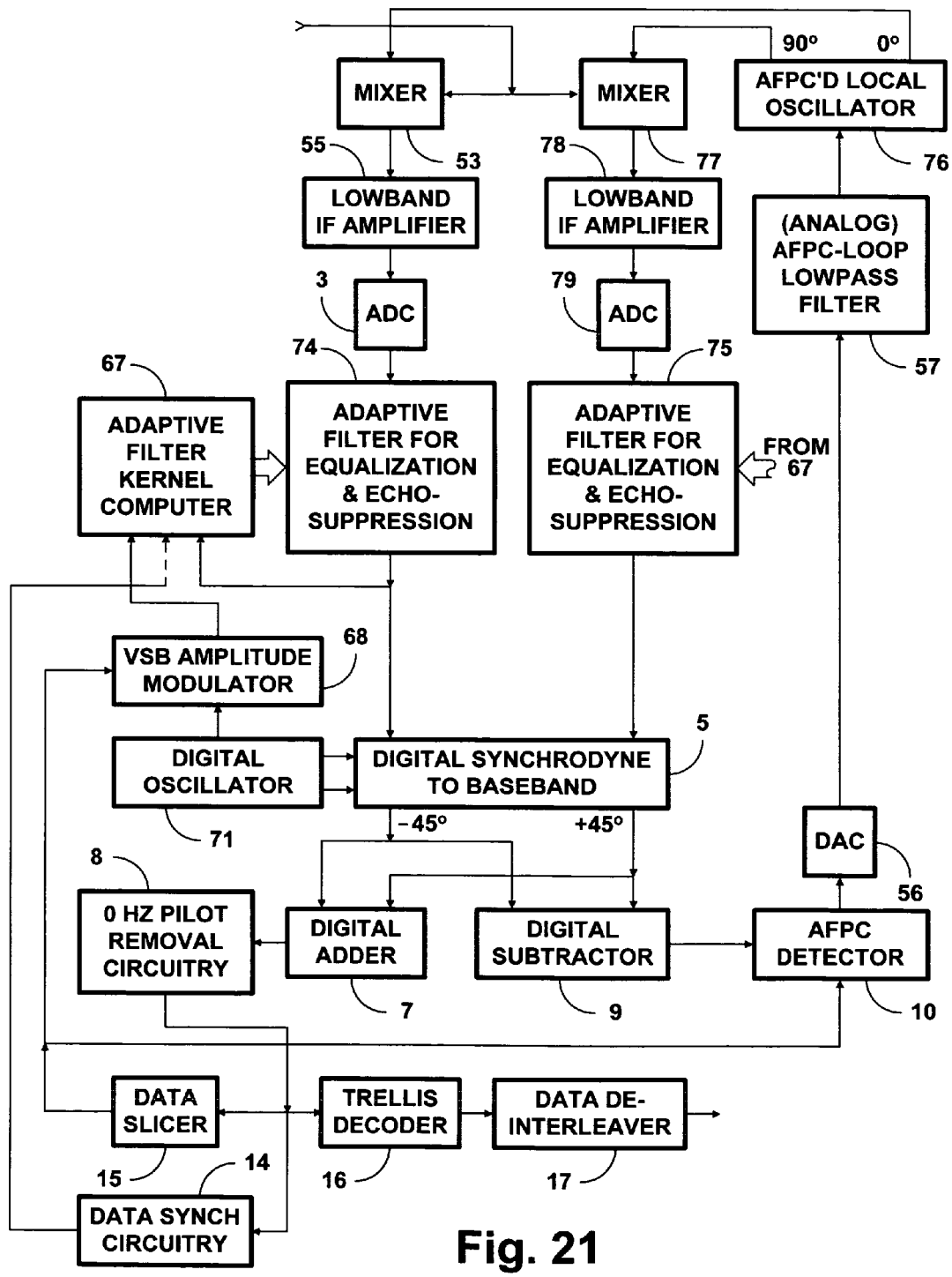
FIG. 21 is a schematic diagram showing a modification of the FIG. 13 DTV signal receiver.
Figure 22:
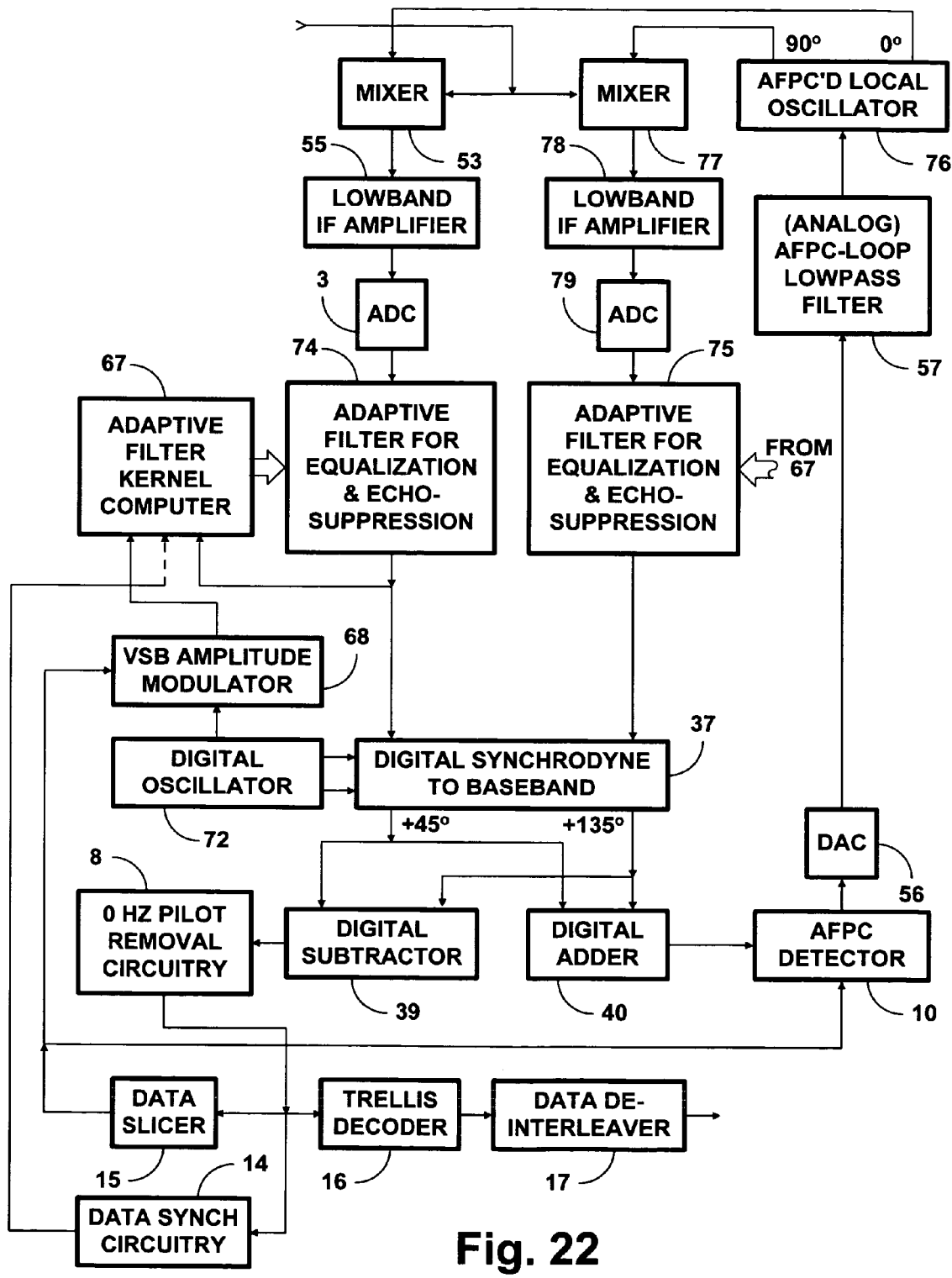
FIG. 22 is a schematic diagram showing a modification of the FIG. 14 DTV signal receiver.

FIGS. 19, 20, 21 and 22 each show an alternative way to phase-split the digital IF signal to be synchrodyned to baseband, rather than using the phase splitter 4. The AFPC'd local oscillator 54 is replaced by an AFPC'd local oscillator 76 that supplies local oscillations of complex form. The local oscillator 76 supplies the real component of these local oscillations in 0° phasing to the mixer 53 to be mixed with IF signal from the DTV receiver front-end circuitry 1. Furthermore, the local oscillator 76 supplies the imaginary component of these local oscillations in 90° phasing to a mixer 77 similar in construction to the mixer 53, to be mixed with IF signal from the DTV receiver front-end circuitry 1. The output signal from the mixer 77 is supplied to a lowband intermediate-frequency amplifier 78 similar in construction to the lowband IF amplifier 55. An analog-to-digital converter 79 similar in construction to the ADC 3 digitizes the lowband IF amplifier 78 response. The response of the ADC 3 and the response of the ADC 79 provide the real and imaginary components, respectively, of a complex lowband IF signal. FIG. 19 shows the FIG. 5 DTV signal receiver (or that receiver already modified per FIG. 7) modified to apply the responses of the ADC 3 and of the ADC 79 to the synchrodyning apparatus 5. FIG. 20 shows the FIG. 6 DTV signal receiver (or that receiver modified per FIG. 8) modified to apply the responses of the ADC 3 and of the ADC 79 to the synchrodyning apparatus 37. FIG. 21 shows the FIG. 13 DTV signal receiver modified to apply the responses of the ADC 3 and of the ADC 79 to the synchrodyning apparatus 5. FIG. 22 shows the FIG. 14 DTV signal receiver modified to apply the responses of the ADC 3 and of the ADC 79 to the synchrodyning apparatus 37.

Figure 23:
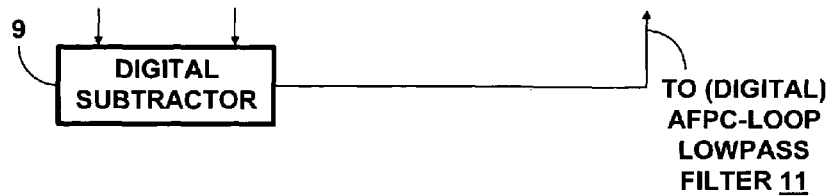
FIG. 23 is a schematic diagram showing in detail one way AFPC detection is implemented in the DTV signal receivers of FIGS. 1 and 11.

FIG. 23 shows how some embodiments of the DTV signal receivers of FIGS. 1 and 9 derive AFPC signal by applying the subtractor 9 difference output signal directly to the digital AFPC-loop lowpass filter 11 as input signal thereto. The sum output signal from the adder 7 is not used in this type of AFPC loop.

Figure 24:
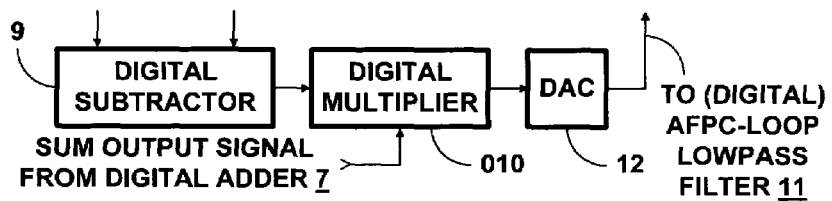
FIG. 24 is a schematic diagram showing in detail another way AFPC detection is implemented in the DTV signal receivers of FIGS. 1 and 11.

FIG. 24 shows how in some embodiments of the DTV signal receivers of FIGS. 1 and 9 a digital multiplier 010 functions as an AFPC detector. The difference output signal from the subtractor 9 and the sum output signal from the adder 7 are multiplied together by the digital multiplier 010 to generate a product output signal supplied to the digital AFPC-loop lowpass filter 11 as input signal thereto.

Figure 25:
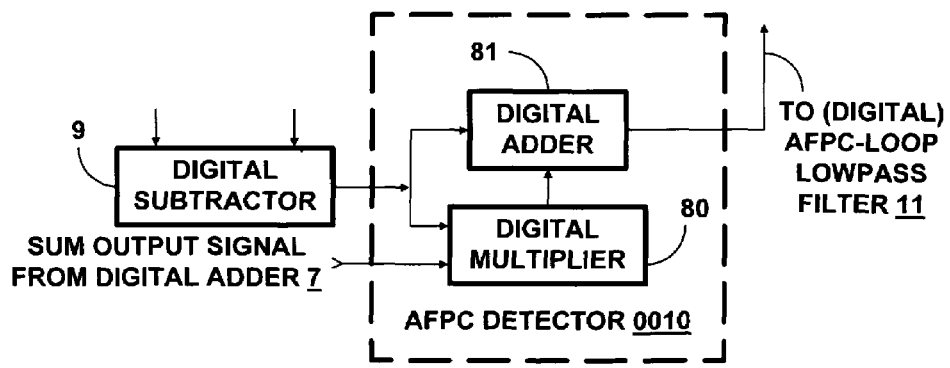
FIG. 25 is a schematic diagram showing in detail yet another way AFPC detection is implemented in the DTV signal receivers of FIGS. 1 and 11.

FIG. 25 is a schematic diagram showing in detail yet another way AFPC detection is implemented in the DTV signal receivers of FIGS. 1 and 9. An AFPC detector 0010 comprises a digital multiplier 80 for multiplying together the difference output signal from the subtractor 9 and the sum output signal from the adder 7 to generate a product output signal. The AFPC detector 0010 further comprises a digital adder 81 for additively combining that product output signal with the difference output signal from the subtractor 9, thereby generating a sum signal used as AFPC detector 0010 response. The digital AFPC-loop lowpass filter 11 is connected to receive this AFPC detector 0010 response as input signal thereto.

FIG. 26 shows how some embodiments of the DTV signal receivers of FIGS. 3 and 10 derive AFPC signal by applying the adder 40 sum output signal directly to the digital AFPC-loop lowpass filter 11 as input signal thereto. The difference output signal from the subtractor 39 is not used in this type of AFPC loop.

FIG. 27 shows that in some embodiments of the DTV signal receivers of FIGS. 3 and 10 a digital multiplier 010 functions as an AFPC detector. The sum output signal from the subtractor 39 and the sum output signal from the adder 40 are multiplied together by the digital multiplier 010 to generate a product output signal supplied to the digital AFPC-loop lowpass filter 11 as input signal thereto.

FIG. 28 is a schematic diagram showing in detail yet another way AFPC detection is implemented in the DTV signal receivers of FIGS. 3 and 10. An AFPC detector 0010 comprises a digital multiplier 80 for multiplying together the difference output signal from the subtractor 39 and the sum output signal from the adder 40 to generate a product output signal. The AFPC detector 0010 further comprises a digital adder 81 for additively combining that product output signal with the sum output signal from the adder 40, thereby generating a sum signal used as AFPC detector 0010 response. The digital AFPC-loop lowpass filter 11 is connected to receive this AFPC detector 0010 response as input signal thereto.

FIG. 29 shows how some embodiments of the DTV signal receivers of FIGS. 5, 13 and 19 derive AFPC signal by applying the subtractor 9 difference output signal directly to the ADC 56 for digitization. The sum output signal from the adder 7 is not used in this type of AFPC loop.

FIG. 30 shows how in some embodiments of the DTV signal receivers of FIGS. 5, 13 and 19 a digital multiplier 010 functions as an AFPC detector. The difference output signal from the subtractor 9 and the sum output signal from the adder 7 are multiplied together by the digital multiplier 010 to generate a product output signal supplied to the ADC 56 for digitization.

FIG. 31 is a schematic diagram showing in detail yet another way AFPC detection is implemented in the DTV signal receivers of FIGS. 5, 13 and 19. An AFPC detector 0010 comprises a digital multiplier 80 for multiplying together the difference output signal from the subtractor 9 and the sum output signal from the adder 7 to generate a product output signal. The AFPC detector 0010 further comprises a digital adder 81 for additively combining that product output signal with the difference output signal from the subtractor 9, thereby generating a sum signal used as AFPC detector 0010 response. The ADC 56 is connected to receive this AFPC detector 0010 response for digitization.

Figure 32:
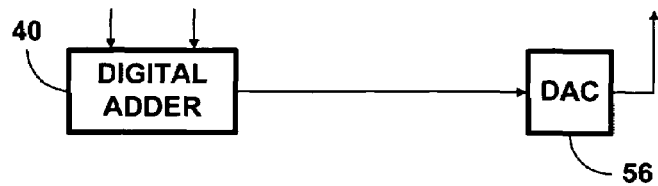
FIG. 32 is a schematic diagram showing in detail one way AFPC detection is implemented in the DTV signal receivers of FIGS. 6 and 16.

FIG. 32 shows how some embodiments of the DTV signal receivers of FIGS. 6, 14 and 20 derive AFPC signal by applying the adder 40 sum output signal directly to the ADC 56 for digitization. The difference output signal from the subtractor 39 is not used in this type of AFPC loop.

Figure 33:
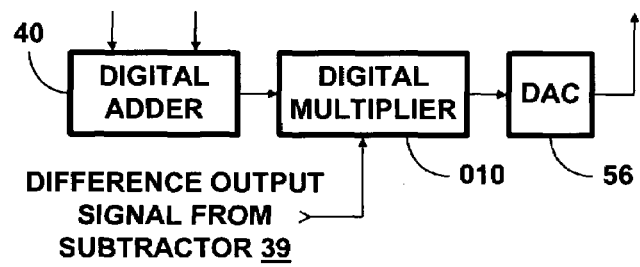
FIG. 33 is a schematic diagram showing in detail another way AFPC detection is implemented in the DTV signal receivers of FIGS. 6 and 16.

FIG. 33 shows how in some embodiments of the DTV signal receivers of FIGS. 6, 14 and 20 a digital multiplier 010 functions as an AFPC detector. The sum output signal from the subtractor 39 and the sum output signal from the adder 40 are multiplied together by the digital multiplier 010 to generate a product output signal supplied to the ADC 56 for digitization.

Figure 34:
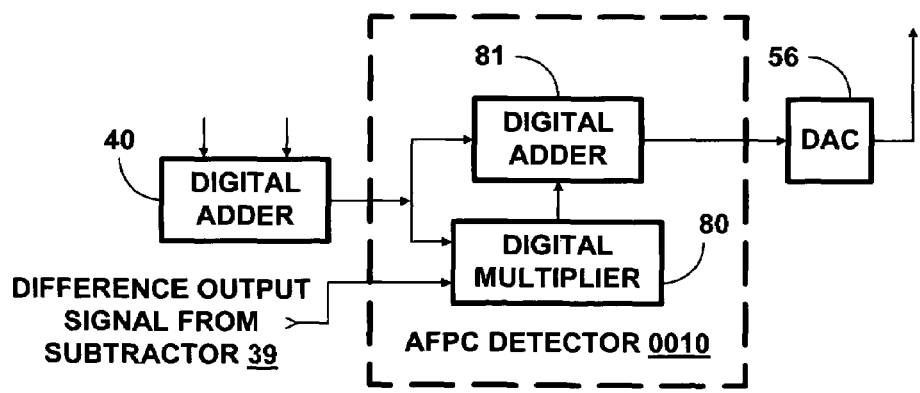
FIG. 34 is a schematic diagram showing in detail yet another way AFPC detection is implemented in the DTV signal receivers of FIGS. 6 and 16.

FIG. 34 is a schematic diagram showing in detail yet another way AFPC detection is implemented in the DTV signal receivers of FIGS. 6, 14 and 20. An AFPC detector 0010 comprises a digital multiplier 80 for multiplying together the difference output signal from the subtractor 39 and the sum output signal from the adder 40 to generate a product output signal. The AFPC detector 0010 further comprises a digital adder 81 for additively combining that product output signal with the sum output signal from the adder 40, thereby generating a sum signal used as AFPC detector 0010 response. The ADC 56 is connected to receive this AFPC detector 0010 response for digitization.

One skilled in the art of electronic circuit design will be enabled by acquaintance with the foregoing disclosure to design readily other synchrodyning apparatus embodying the invention, and this should be borne in mind when considering the scopes of the claims which follow. In particular, the phase-splitting technique disclosed in FIGS. 19, 20, 21 and 22 can be employed in various other receiver configurations. Synchrodyning apparatuses using the precepts of the invention can be constructed completely in analog form, almost completely in digital form, or partially in analog form and partially in digital form, as will be evident to one skilled in the art of electronic circuit design.

In the claims which follow, the word "said" is used for indicating antecedence, rather than the definite article "the" being so used.

What is claimed is:

1. Synchrodyning apparatus comprising:
    phase-splitter circuitry connected for converting to complex form a first amplitude-modulated carrier wave modulated in accordance with a succession of digital symbols and received by said phase-splitter circuitry as the input signal thereof;
    first synchronous detection circuitry connected for performing a first synchronous detection procedure on said first amplitude-modulated carrier wave of complex form to generate a first baseband signal having respective real and imaginary components, said first amplitude-modulated carrier wave of complex form being mixed in the first synchronous detection procedure with first local oscillations of complex form and of a frequency similar to that of said carrier wave;
    second synchronous detection circuitry connected for performing a second synchronous detection procedure on said first amplitude-modulated carrier wave of complex form to generate a second baseband signal having respective real and imaginary components, said first amplitude-modulated carrier wave being mixed in the second synchronous detection procedure with second local oscillations of complex form and of a frequency similar to that of said carrier wave, the respective phasings of said first local oscillations and said second local oscillations being in a quadrature relationship with each other and both being maintained substantially offset from the phasing of said carrier wave; and
    combining circuitry for additively combining said first baseband signal and said second baseband signal to generate a third baseband signal and for differentially combining said first baseband signal and said second baseband signal to generate a fourth baseband signal, said respective phasings of said first local oscillations and said second local oscillations being such that one of said third and said fourth baseband signals is an essentially real baseband signal and the other is an essentially imaginary baseband signal, said essentially real baseband signal reproducing said succession of digital symbols during favorable conditions of reception of said first amplitude-modulated carrier wave.

2. The synchrodyning apparatus of claim 1 further comprising:
    controlled oscillator circuitry for generating said first local oscillations and said second local oscillations, connected for supplying said first local oscillations to said first synchronous detection circuitry and for supplying said second local oscillations to said second synchronous detection circuitry, the frequency and respective phases of which said first local oscillations and said second local oscillations are controlled by an automatic frequency and phase control signal; and
    circuitry for developing said automatic frequency and phase control signal from said essentially imaginary baseband signal.

3. The synchrodyning apparatus of claim 2 in combination with:
    an adaptive filter connected for responding to said essentially real baseband signal to provide channel-equalization and echo-suppression filtering thereof in a response of that said adaptive filter, said adaptive filter having a kernel of weighting coefficients that are adjustable.

4. The combination of claim 3 further comprising:
    a data slicer connected for responding to the response of said adaptive, filter to generate estimates of symbols used to modulate said first amplitude-modulated carrier wave; and
    a computer connected for adjusting the weighting coefficients in the kernel of said adaptive filter, said adjusting being done by said computer responsive to comparison of the response of said adaptive filter and said estimates of symbols used to modulate said first amplitude-modulated carrier wave.

5. The synchrodyning apparatus of claim 1 further comprising:
    oscillator circuitry for generating said first local oscillations and said second local oscillations, connected for supplying said first local oscillations to said first synchronous detection circuitry and for supplying said second local oscillations to said second synchronous detection circuitry;

controlled oscillator circuitry connected for generating third local oscillations, the frequency and phase of which said third local oscillations are controlled by an automatic frequency and phase control signal;

a mixer connected for multiplicatively mixing a second amplitude-modulated carrier wave with said third local oscillations to generate said first amplitude-modulated carrier wave supplied to said phase-splitter circuitry as said input signal thereof; and circuitry for developing said automatic frequency and phase control signal from said essentially imaginary baseband signal.

6. The synchrodyning apparatus of claim 5 in combination with:

an adaptive filter connected for responding to said essentially real baseband signal to provide channel-equalization and echo-suppression filtering thereof in a response of that said adaptive filter, said adaptive filter having a kernel of weighting coefficients that are adjustable.

7. The combination of claim 6 further comprising:

a data slicer connected for responding to the response of said adaptive filter to generate estimates of symbols used to modulate said first amplitude-modulated carrier wave; and a computer connected for adjusting the weighting coefficients in the kernel of said adaptive filter, said adjusting being done by said computer responsive to comparison of the response of said adaptive filter and said estimates of symbols used to modulate said first amplitude-modulated carrier wave.

8. The synchrodyning apparatus of claim 1 in combination with:

a first adaptive filter connected for responding to said essentially real baseband signal and providing channel-equalization and echo-suppression filtering thereof in a response of that said first adaptive filter, said first adaptive filter having a kernel of weighting coefficients that are adjustable; and a second adaptive filter connected for responding to said essentially imaginary baseband signal and providing channel-equalization and echo-suppression filtering thereof in a response of that said second adaptive filter, said second adaptive filter having a kernel of weighting coefficients that are adjustable.

9. The combination of claim 8 further comprising:

a data slicer connected for responding to the response of said first adaptive filter to generate estimates of symbols used to modulate said first amplitude-modulated carrier wave; and a computer connected for-adjusting the weighting coefficients in the kernel of said first adaptive filter and for adjusting the weighting coefficients in the kernel of said second adaptive filter similarly, the similar adjusting being done by said computer responsive to comparison of the response of said first adaptive filter and said estimates of symbols used to modulate said first amplitude-modulated carrier wave.

10. The synchrodyning apparatus of claim 8 further comprising:

controlled oscillator circuitry for generating said first local oscillations and said second local oscillations, connected for supplying said first local oscillations to said first synchronous detection circuitry and for supplying said second local oscillations to said second synchronous detection circuitry, the frequency and respective phases of which said first local oscillations and said second local oscillations are controlled by an automatic frequency and phase control signal; and circuitry for developing said automatic frequency and phase control signal from said response of said second adaptive filter to said essentially imaginary baseband signal.

11. The synchrodyning apparatus of claim 8 further comprising:

oscillator circuitry for generating said first local oscillations and said second local oscillations, connected for supplying said first local oscillations to said first synchronous detection circuitry and for supplying said second local oscillations to said second synchronous detection circuitry;

controlled oscillator circuitry connected for generating third local oscillations, the frequency and phase of which said third local oscillations are controlled by an automatic frequency and phase control signal;

a mixer connected for multiplicatively mixing a second amplitude-modulated carrier wave with said third local oscillations to generate said first amplitude-modulated carrier wave supplied to said phase-splitter circuitry as said input signal thereof; and circuitry for developing said automatic frequency and phase control signal from said response of said second adaptive filter to said essentially imaginary baseband signal.

12. The synchrodyning apparatus of claim 1 in combination with:

an adaptive filter connected to provide said first amplitude-modulated carrier wave to said phase-splitter circuitry, said first amplitude-modulated carrier wave being provided as a channel-equalization and echo-suppression filtering response of said adaptive filter to a second amplitude-modulated carrier wave received as an input signal by said adaptive filter.

13. The combination of claim 12 further comprising:

a data slicer connected for responding to said essentially real baseband signal to generate estimates of symbols used to modulate said first amplitude-modulated carrier wave;

modulator circuitry connected for receiving said estimates of symbols used to modulate said first amplitude-modulated carrier wave as a modulation input signal and for modulating the amplitude of a carrier wave of a frequency similar to the carrier frequency of said first amplitude-modulated carrier wave, thereby generating as a response of said modulator circuitry a third amplitude-modulated carrier wave; and a computer connected for adjusting the weighting coefficients in the kernel of said adaptive filter responsive to comparison of the response of said adaptive filter and the response of said modulator circuitry.

14. The synchrodyning apparatus of claim 1 further comprising:

constant-frequency oscillator circuitry for generating said first local oscillations and said second local oscillations, connected for supplying said first local oscillations to said first synchronous detection circuitry and for supplying said second local oscillations to said second synchronous detection circuitry.

15. The synchrodyning apparatus of claim 14 wherein said phase-splitter circuitry comprises:

controlled oscillator circuitry connected for generating third local oscillations of complex form having real and imaginary components of similar amplitudes and of respective phasings that are in a quadrature relationship with each other, the frequency and phasings of which said real and said imaginary components of said third local oscillations are controlled by an automatic frequency and phase control signal;

circuitry for developing said automatic frequency and phase control signal from said essentially imaginary baseband signal;

first mixer circuitry connected for mixing said real component of said third local oscillations of complex form with said first amplitude-modulated carrier wave received by said phase-splitter circuitry as the input signal thereof, thus to generate said real component of said first amplitude-modulated carrier wave of complex form; and second mixer circuitry connected for mixing said imaginary component of said third local oscillations of complex form with said first amplitude-modulated carrier wave received by said phase-splitter circuitry as the input signal thereof, thus to generate said imaginary component of said first amplitude-modulated carrier wave of complex form.

16. Synchrodyning apparatus comprising:

phase-splitter circuitry connected for converting to complex form a first amplitude-modulated carrier wave modulated in accordance with a succession of digital symbols and received by said phase-splitter circuitry as the input signal thereof;

a first adaptive filter connected for responding to the real component of said first amplitude-modulated carrier wave to provide channel-equalization and echo-suppression filtering thereof in a response of that said first adaptive filter;

a second adaptive filter connected for responding to the imaginary component of said first amplitude-modulated carrier wave to provide channel-equalization and echo-suppression filtering thereof in a response of that said second adaptive filter, the responses of said first and said second adaptive filters corresponding to the real and imaginary components of a second amplitude-modulated carrier wave that is of complex form;

first synchronous detection circuitry connected for performing a first synchronous detection procedure on said second amplitude-modulated carrier wave of complex form to generate a first baseband signal having respective real and imaginary components, said second amplitude-modulated carrier wave of complex form being mixed in said first synchronous detection procedure with first local oscillations of complex form and of a frequency similar to that of said first amplitude-modulated carrier wave;

second synchronous detection circuitry connected for performing a second synchronous detection procedure on said second amplitude-modulated carrier wave of complex form to generate a second baseband signal having respective real and imaginary components, said second amplitude-modulated carrier wave being mixed in said second synchronous detection procedure with second local oscillations of complex form and of a frequency similar to that of said first amplitude-modulated carrier wave, the respective phasings of said first local oscillations and said second local oscillations being in a quadrature relationship with each other and both being maintained substantially offset from the phasing of said first amplitude-modulated carrier wave; and combining circuitry for additively combining said first baseband signal and said second baseband signal to generate a third baseband signal and for differentially combining said first baseband signal and said second baseband signal to generate a fourth baseband signal, said respective phasings of said first local oscillations and said second local oscillations being such that one of said third and said fourth baseband signals is an essentially real baseband signal and the other is an essentially imaginary baseband signal, said essentially real baseband signal reproducing said succession of digital symbols during favorable conditions of reception of said first amplitude-modulated carrier wave.

17. The synchrodyning apparatus of claim 16 further comprising:

controlled oscillator circuitry for generating said first local oscillations and said second local oscillations, connected for supplying said first local oscillations to said first synchronous detection circuitry and for supplying said second local oscillations to said second synchronous detection circuitry, the frequency and respective phases of which said first local oscillations and said second local oscillations are controlled by an automatic frequency and phase control signal; and circuitry for developing said automatic frequency and phase control signal from said essentially imaginary baseband signal.

18. The synchrodyning apparatus of claim 17 in combination with:

a data slicer connected for responding to said essentially real baseband signal to generate estimates of symbols used to modulate said first amplitude-modulated carrier wave;

modulator circuitry connected for receiving said estimates of symbols used to modulate said first amplitude-modulated carrier wave as an modulation input signal and for modulating the amplitude of a carrier wave of a frequency similar to the carrier frequency of said first and said second amplitude-modulated carrier waves, thereby generating as a response of said modulator circuitry a third amplitude-modulated carrier wave; and a computer connected for adjusting the weighting coefficients in the kernel of said first adaptive filter and for adjusting the weighting coefficients in the kernel of said second adaptive filter similarly, the similar adjusting being done by said computer responsive to comparison of said response of said first adaptive filter and said response of said modulator circuitry.

19. The synchrodyning apparatus of claim 16 further comprising:

oscillator circuitry for generating said first local oscillations and said second local oscillations, connected for supplying said first local oscillations to said first synchronous detection circuitry and for supplying said second local oscillations to said second synchronous detection circuitry;

controlled oscillator circuitry connected for generating third local oscillations, the frequency and phase of which said third local oscillations are controlled by an automatic frequency and phase control signal;

a mixer connected for multiplicatively mixing a third amplitude-modulated carrier wave with said third local oscillations to generate said first amplitude-modulated carrier wave supplied to said phase-splitter circuitry as said input signal thereof; and circuitry for developing said automatic frequency and phase control signal from said essentially imaginary baseband signal.

20. The synebrodyning apparatus of claim 19 in combination with:
- a data slicer connected for responding to said essentially real baseband signal to generate estimates of symbols used to modulate said first amplitude-modulated carrier wave;
- modulator circuitry connected for receiving said estimates of symbols used to modulate said first amplitude-modulated carrier wave as a modulation input signal and for modulating the amplitude of a carrier wave of a frequency similar to the carrier frequency of said first and said second amplitude-modulated carrier waves, thereby generating a fourth amplitude-modulated carrier wave as a response of said modulator circuitry; and
- a computer connected for adjusting the weighting coefficients in the kernel of said first adaptive filter and for adjusting the weighting coefficients in the kernel of said second adaptive filter similarly, the similar adjusting being done by said computer responsive to comparison of said response of said first adaptive filter and said response of said modulator circuitry.

21. Synchrodyning apparatus comprising:
- a first adaptive filter connected for responding to a real component of a first amplitude-modulated carrier wave to provide channel-equalization and echo-suppression filtering thereof in a response of that said first adaptive filter;
- a second adaptive filter connected for responding to an imaginary component of said first amplitude-modulated carrier wave to provide channel-equalization and echo-suppression filtering thereof in a response of that said second adaptive filter, the responses of said first and said second adaptive filters corresponding to the real and imaginary components of a second amplitude-modulated carrier wave that is of complex form;
- first synchronous detection circuitry connected for performing a first synchronous detection procedure on said second amplitude-modulated carrier wave of complex form to generate a first baseband signal having respective real and imaginary components, said second amplitude-modulated carrier wave of complex form being mixed in the first synchronous detection procedure with first local oscillations of complex form and of a frequency similar to that of said first amplitude-modulated carrier wave;
- second synchronous detection circuitry connected for performing a second synchronous detection procedure on said second amplitude-modulated carrier wave of complex form to generate a second baseband signal having respective real and imaginary components, said second amplitude-modulated carrier wave of complex form being mixed in the second synchronous detection procedure with second local oscillations of complex form and of a frequency similar to that of said said first amplitude-modulated carrier wave, the respective phasings of said first local oscillations and said second local oscillations being in a quadrature relationship with each other and both being maintained substantially offset from the phasing of said first amplitude-modulated carrier wave;
- combining circuitry for additively combining said first baseband signal and said second baseband signal to generate a third baseband signal and for differentially combining said first baseband signal and said second baseband signal to generate a fourth baseband signal, said respective phasings of said first local oscillations and said second local oscillations being such that one of said third and said fourth baseband signals is an essentially real baseband signal and the other is an essentially imaginary baseband signal, said essentially real baseband signal reproducing during favorable conditions of reception an original signal that modulated the amplitude of a third amplitude-modulated carrier wave;
- oscillator circuitry for generating said first local oscillations and said second local oscillations, connected for supplying said first local oscillations to said first synchronous detection circuitry and for supplying said second local oscillations to said second synchronous detection circuitry;
- controlled oscillator circuitry connected for generating third local oscillations of complex form having real and imaginary components of similar amplitudes and of respective phasings that are in a quadrature relationship with each other, the frequency and phasings of which said real and said imaginary components of said third local oscillations are controlled by an automatic frequency and phase control signal;
- circuitry for developing said automatic frequency and phase control signal from said essentially imaginary baseband signal;
- first mixer circuitry connected for mixing said third amplitude-modulated carrier wave with said real component of said third local oscillations of complex form to generate said real component of said first amplitude-modulated carrier wave of complex form, the amplitude of said third amplitude-modulated carrier wave modulated; and
- second mixer circuitry connected for mixing said third amplitude-modulated carrier wave with said imaginary component of said third local oscillations of complex form to generate said imaginary component of said first amplitude-modulated carrier wave of complex form, said synchrodyning apparatus connected for receiving said third amplitude-modulated carrier wave as its input signal.

22. The synchrodyning apparatus of claim 21 in combination with:
- a data slicer connected for responding to said essentially real baseband signal to generate estimates of symbols used to modulate said third amplitude-modulated carrier wave;
- modulator circuitry connected for receiving said estimates of symbols used to modulate said third amplitude-modulated carrier wave as an modulation input signal and for modulating the amplitude of a carrier wave of a frequency similar to the carrier frequency of said first and said second amplitude-modulated carrier waves, thereby generating as a response of said modulator circuitry a fourth amplitude-modulated carrier wave; and
- a computer connected for adjusting the weighting coefficients in the kernel of said first adaptive filter and for adjusting the weighting coefficients in the kernel of said second adaptive filter similarly, the similar adjusting being done by said computer responsive to comparison of said response of said first adaptive filter and said response of said modulator circuitry.

* * * * *